US007029820B2

(12) United States Patent
Hotta et al.

(10) Patent No.: US 7,029,820 B2

(45) **Date of Patent: *Apr. 18, 2006**

(54) SUPPORT FOR LITHOGRAPHIC PRINTING PLATE AND PRESENSITIZED PLATE AND METHOD OF PRODUCING LITHOGRAPHIC PRINTING PLATE

(75) Inventors: Yoshinori Hotta, Shizuoka (JP); Hisashi Hotta, Shizuoka (JP); Tadashi Endo, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/265,323

(22) Filed: Oct. 7, 2002

(65) Prior Publication Data

US 2003/0165768 A1 Sep. 4, 2003

(30) Foreign Application Priority Data

| | | | |
|---|---|---|---|
| Oct. 5, 2001 | (JP) | ............................. | 2001-309304 |
| Nov. 15, 2001 | (JP) | ............................. | 2001-349926 |
| Dec. 3, 2001 | (JP) | ............................. | 2001-368258 |

(51) Int. Cl.

| | |
|---|---|
| ***G03F 7/023*** | (2006.01) |
| ***G03F 7/09*** | (2006.01) |
| ***G03C 1/77*** | (2006.01) |

(52) U.S. Cl. ................ 430/165; 430/278.1; 430/281.1; 430/302; 205/213; 205/214

(58) Field of Classification Search ............ 430/270.1, 430/278.1, 302, 165, 281.1; 205/213, 214

See application file for complete search history.

(56) References Cited

U.S. PATENT DOCUMENTS

| | | | | |
|---|---|---|---|---|
| 4,301,229 | A * | 11/1981 | Sakaki et al. | ............... 430/158 |
| 5,518,589 | A | 5/1996 | Matsuura et al. | |
| 5,832,834 | A | 11/1998 | Nishino et al. | |
| 5,837,345 | A | 11/1998 | Nishino et al. | |
| 6,103,087 | A | 8/2000 | Mori | |
| 6,716,567 | B1 * | 4/2004 | Endo et al. | .............. 430/278.1 |
| 2001/0009129 | A1 | 7/2001 | Kunita et al. | |

FOREIGN PATENT DOCUMENTS

| | | | |
|---|---|---|---|
| JP | 7-61161 | A | 3/1995 |
| JP | 07-271039 | A | 10/1995 |
| JP | 08-258440 | A | 10/1996 |
| JP | 08-300843 | A | 11/1996 |
| JP | 8-300844 | A | 11/1996 |
| JP | 9-234971 | A | 9/1997 |
| JP | 10-16419 | A | 1/1998 |
| JP | 10-35133 | A | 2/1998 |
| JP | 11-99758 | A | 4/1999 |
| JP | 11-115340 | A | 4/1999 |
| JP | 11-167204 | A | 6/1999 |
| JP | 11-167207 | A | 6/1999 |
| JP | 11-174689 | A | 7/1999 |
| JP | 11-208138 | A | 8/1999 |
| JP | 2001-166462 | A | 6/2001 |
| JP | 2001-213066 | A | 8/2001 |
| JP | 2001-232965 | A | 8/2001 |
| WO | WO-200234544 | * | 5/2002 |

* cited by examiner

*Primary Examiner*—John S. Chu

(74) *Attorney, Agent, or Firm*—Sughrue Mion, PLLC

(57) ABSTRACT

Disclosed is a support for a lithographic printing plate obtainable by performing at least graining treatment on an aluminum plate, having on its surface thereof, a grain shape with a structure in which a grained structure with medium undulation of 0.5 to 5 μm average aperture diameter and a grained structure with small undulation of 0.01 to 0.2 μm average aperture diameter are superimposed, and a presensitized plate provided with an image recording layer on the support for a lithographic printing plate. By using this presensitized plate, a balance between scum resistance and press life when a lithographic printing plate is produced therefrom, which has been in a trade-off relation in the past, can be maintained at a high level.

14 Claims, 3 Drawing Sheets

SUPPORT FOR LITHOGRAPHIC PRINTING PLATE AND PRESENSITIZED PLATE AND METHOD OF PRODUCING LITHOGRAPHIC PRINTING PLATE

BACKGROUND OF THE INVENTION

1. Field of the Invention

The present invention relates to a support for a lithographic printing plate, a presensitized plate, and a method of producing a lithographic printing plate. More particularly, the present invention relates to a support for a lithographic printing plate having an optimum surface shape achieving both high scum resistance and long press life when a lithographic printing plate is produced, a presensitized plate using the support for a lithographic printing plate, and a method of producing a lithographic printing plate excellent in scum resistance and press life.

2. Description of the Related Art

Lithography is a printing process which makes use of a nature that water and oil are essentially unmixable with each other. On the printing plate surface of a lithographic printing plate used in this process, areas that receive water and repel an oil-based ink (hereinafter referred to as “non-image areas”) and the other areas that repel water and receive an oil-based ink (hereinafter referred to as “image areas”) are formed.

Since an aluminum support for a lithographic printing plate used for a lithographic printing plate (hereinafter referred to simply as “a support for a lithographic printing plate”) is used as such that the surface thereof plays a role of non-image areas, various conflicting performances are required, such as excellency in water wettability and water receptivity as well as excellency in contact characteristics with an image recording layer provided on the support.

If the water wettability of a support is too low, an ink is attached to non-image areas at the time of printing, thereby causing a dirt on a blanket cylinder and further a so-called scum. In addition, if the water receptivity is too low, a shadow portion may be plugged unless much fountain solution is applied at the time of printing. Therefore, a so-called water range is narrowed.

In order to obtain a support for a lithographic printing plate excellent in these performances, generally asperities are provided for the surface of an aluminum plate by performing graining (graining treatment) thereon. As shown below, various shapes of the asperities are proposed. JP 8-300844 A (the term “JP XX-XXXXXX A” as used herein means an “unexamined published Japanese patent application”), describes a triple grained structure having a grained structure of large undulation, a grained structure of medium undulation, and a grained structure of small undulation, with aperture diameters of the grained structures of medium and small undulations specified. JP 11-99758 A and JP 11-208138 A describe specifying the diameter of a grained structure with small undulation in the double structure with a grained structure of large and small undulations. JP 11-167207 A describes an art providing large and small double concave portions (pits) and further fine protrusions JP 2023476 B (the term “JP XX-XXXXXX B” as used herein means an “examined Japanese patent publication”) describes a double structure with the aperture diameters specified. JP 8-300843 A describes a double structure with a factor a30 indicating smoothness of a surface specified. JP 10-35133 A describes a structure with the ratio of diameters of pits superimposed at a time of a plurality of electrochemical graining treatments (hereinafter referred also to as an “electrolytic graining treatment”).

Methods to be used for this graining include a mechanical graining treatments such as ball graining, brush graining, wire graining and blast graining, an electrolytic graining treatment performing electrolytic etching on an aluminum plate in an electrolyte containing hydrochloric aid and/or nitric acid, and a composite graining treatment combining a mechanical graining treatment and an electrolytic graining treatment as described in U.S. Pat. No. 4,476,006 and the like.

SUMMARY OF THE INVENTION

However, in the aforementioned related arts, since scum resistance and press life are traded off, both cannot be achieved at the same time.

Therefore, it is the first object of the present invention to solve this problem and provide a presensitized plate which is excellent in both scum resistance and high press life can be achieved, and a support for a lithographic printing plate used for the presensitized plate. In addition, it is the second object of the present invention to provide a method of producing a lithographic printing plate excellent in scum resistance and press life.

In the meantime, with the development of an image formation technology, a direct plate making is becoming possible by scanning a laser beam with a narrowed-down beam on the surface of the presensitized plate to directly form a lettered original, an image original or the like on the presensitized plate, dispensing with a film original.

Particularly, a presensitized plate called a thermal type or a heat mode type where an image is formed with heat obtained by generating photothermal conversion in an image recording layer with irradiation of an infrared-ray laser beam is proposed in a variety of forms since it has a merit that the plate can be used in a bright room. Among these presensitized plates, a so-called thermal positive type presensitized plate which forms a positive image allowing an image recording layer to be alkali-soluble by heat uses a subtle change in the intermolecular interaction of a binder in the image recording layer by a laser exposure as an image formation principle. Therefore, a difference between the alkali-soluble state in the exposed area and the non-alkali-soluble state in the unexposed area is small. For that reason, in order to obtain a practicable clear discrimination, used are means for forming an image recording layer structure with suppressed development solubility of the unexposed area by providing a surface slightly soluble layer in a developer as the top layer of the image recording layer, means for suppressing the development solubility of the unexposed area by adding to the developer a low absorbable development inhibitor component to the unexposed area on the surface of the image recording layer, and the like.

If the surface slightly soluble layer is, however, damaged due to some cause, even an area which is supposed to be an image area becomes soluble in the developer. That is, practically, a printing plate is too easily damaged. For that reason, it is the status quo that handling of the presensitized plate at the time of working is difficult, since scratch-like non-image portions are generated even by a subtle touching such as hitting of the plates when handling the presensitized plate, a subtle rubbing with interleaving sheets, or a contact of fingers with plate surface. Although countermeasures are taken to lower coefficient of friction by providing a layer having a fluorine-containing surfactant or a wax on the surface of the image recording layer in order to improve damage resistance, they are not sufficient.

In the meantime, in order to increase discrimination, efficiency of development is also studied, an attempt is made to provide a water receptive layer by silicate treatment or an alkali-soluble undercoat layer (alkali-soluble layer) between the image recording layer and the support. According to these methods, it is certainly possible to ensure development capacity to some extent and obtain a development latitude within a practical range. However, contact characteristics between the image recording layer and the support deteriorate. In addition, if the surface shape of the support is smoothened to remove deep concave portions existent on the support surface which cause residual layers in order to increase scum resistance, press life largely deteriorates, thereby the presensitized plate becoming impractical. For this reason, a presensitized plate that is at a level that meets the requirements of easy printing, that is excellent press life and high scum resistance has not been materialized yet.

Such a presensitized plate of a type where an infrared absorbent existent in the image recording layer develops a photothermal conversion action thereof to generate a heat by exposure, and an image is formed on the image recording layer by the generated heat has also following problems.

That is, in a thermal type image formation like this, a heat is generated by a photothermal conversion agent in a photosensitive layer by a laser beam irradiation and triggers an image formation reaction. However, since thermal conductivity of an aluminum support subjected to graining treatment is much higher than that of the image recording layer., a heat generated in the vicinity of an interface between the image recording layer and the support diffuses inside the support before it is sufficiently used for image formation.

Consequently, in the case of the aforementioned thermal positive type image recording layer, if a heat diffuses inside the support and an alkali-soluble reaction is insufficient, a problem arises that residual layers are produced in an area which is supposed to be non-image areas, thus sensitivity becomes low, constituting an essential problem with a thermal positive type image recording layer. In addition, a thermal type presensitized plate like this requires an infrared-ray absorbent having a photothermal converting function. Since the molecular weights of these absorbents are relatively large, their solubilities are low. In addition, these absorbents are difficult to be removed since they are attached to micro apertures (micropores) generated by anodizing treatment. Therefore, a problem arises that residual layers are easily produced in a development process with an alkali developer.

It is an object of a third aspect of the present invention to provide a thermosensitive presensitized plate that overcomes the defects of the aforementioned related arts. That is, the third object is to provide a thermosensitive presensitized plate that is capable of efficiently using heat for image formation, with high sensitivity, long press life, and high scum resistance in non-image areas, and a support for a lithographic printing plate used for the presensitized plate.

In order to achieve the aforementioned first object, the inventors have intensively studied the size of an asperity structure of the surface of a support for a lithographic printing plate and their combination to finally find out that a combination of asperities with specified sizes can maintain a balance between scum resistance and press life at a high level.

In order to achieve the aforementioned first object, the inventors have also intensively studied the surface shape of a support for a lithographic printing plate to finally find out that a specified combination of surface roughness, surface area ratio and steepness which are factors to indicate a surface shape obtained by using an atomic force microscope can maintain a balance between scum resistance and press life at a high level.

In addition, conventionally, in order to improve scum resistance (resistance to dirtiness) of a lithographic printing plate, as a general practice, a developer contains an alkali metal silicate such that Si atoms are allowed to be attached to only non-image areas obtained by removing an image recording layer, thus improving water wettability of the non-image areas. If a developer containing an alkali metal silicate is used for development, however, problems occur such as that a solid substance attributable to $SiO_2$ easily deposits, a gel attributable to $SiO_2$ generates in a neutralization treatment for treating the waste of the developer. As a result, there are cases where non-image areas is whitened at the time of development, or scum or sludge is generated at the time of development.

In the meantime, when development is performed using a developer containing substantially no alkali metal silicates, there is a problem that, if the support for a lithographic printing plate is not subjected to alkali metal silicate treatment, a phenomenon that an ink is not easily removed when a printing machine stops and printing is restarted after the lithographic printing plate is left as it stands on the printing machine (deterioration in scum resistance after being left) easily occurs.

The inventors have found out that, from a presensitized plate which uses the aforementioned support for a lithographic printing plate, a lithographic printing plate excellent in scum resistance after being left can be obtained if development is performed with a developer containing substantially no alkali metal silicates after exposure even if the aforementioned support for a lithographic printing plate is not subjected to the alkali metal silicate treatment.

In addition, in order to achieve the aforementioned third object, the inventors also have intensively studied a surface shape of the support for a lithographic printing plate and a water receptive layer provided thereon to finally find out that when surface roughness, surface area ratio and steepness, as well as thermal conductivity of the water receptive layer which are factors to indicate a surface shape obtained by using an atomic force microscope are used in a specific combination, high sensitivity and long press life are exhibited, and scum is not easily generated in non-image areas. That is, they have found that when a presensitized plate with a specified surface shape (a grained structure with medium undulation and a grained structure with small undulation) and/or a specified surface shape physical properties ($R_a$, ΔS, a30 and a60), provided with a water receptive layer having thermal conductivity within a specified range thereon, and a photothermal layer is further provided thereon is used, sensitivity is high, and when a lithographic printing plate is produced, press life is long and scum is not easily generated in the non-image areas.

The inventors have completed the present invention based on these findings.

That is, the present invention provides (1) to (7) to be described below.

(1) A support for a lithographic printing plate obtainable by performing at least graining treatment on an aluminum plate, having on its surface thereof, a grain shape with a structure in which a grained structure with medium undulation of 0.5 to 5 μm average aperture diameter and a grained structure with small undulation of 0.01 to 0.2 μm average aperture diameter are superimposed (the first aspect of the present invention).

(2) A support for a lithographic printing plate obtainable by performing at least graining treatment on an aluminum plate, having on its surface thereof, a grain shape with a structure in which a grained structure with large undulation of 5 to 100 μm average wavelength, a grained structure with medium undulation of 0.5 to 5 μm average aperture diameter, and a grained structure with small undulation of 0.01 to 0.2 μm average aperture diameter are superimposed.

(3) The support for a lithographic printing plate according to (1) or (2) mentioned above, in which an average of ratios of depths to the aperture diameters of the aforementioned grained structure with small undulation is 0.2 or more.

(4) A support for a lithographic printing plate, in which each of $R_a$, ΔS, a30 and a60 obtained from the three-dimensional data taken by measuring 50 μm□ area on its surface at 512×512 points with an atomic force microscope satisfies the following conditions as described in (i) to (iv) (the second aspect of the present invention).

(i) $R_a$: 0–45 μm or more (ii) ΔS: 30% or more (iii) a30: 55% or more (iv) a60: 10% or less In these conditions, $R_a$ indicates a surface roughness obtained after removing components of wavelength 2 μm or longer form the aforementioned three-dimensional data.

ΔS is obtained by the following equation from an actual area $S_x$ calculated from the aforementioned three-dimensional data with the approximation three-point method and a geometrically measured area $S_0$:

$$\Delta S=(S_x-S_0)/S_0\times 100(\%).$$

a30 and a60 indicate area ratio of an area of gradient 30° or more and an area of gradient 60° or more, respectively, obtained after removing components of wavelength 2 μm or longer from the aforementioned three-dimensional data.

A support for a lithographic printing plate that meets the requirements of both first aspect and the second aspect of the present invention is the particularly preferred form.

One of the preferable aspects is that a support for a lithographic printing plate according to any one of the above (1) to (4) is obtained by sequentially performing mechanical graining treatment, alkali etching treatment, desmutting treatment with an acid, and electrochemical graining treatment with an electrolyte containing nitric acid electrochemical graining treatment with an electrolyte containing hydrochloric acid, alkali etching treatment, and desmutting treatment on an aluminum plate.

(5) The support for a lithographic printing plate according to any one of (1) to (4) mentioned above, including a water receptive layer with thermal conductivity of 0.05 to 0.5W/(m·K) on the surface (the third aspect of the present invention).

It is preferable when the aforementioned water receptive layer is an anodized layer formed by performing anodizing treatment.

It is also preferable that density of the aforementioned water receptive layer is 1,000 to 3,200 kg/$m^3$ or porosity thereof is 20 to 70%.

It is more preferable that alkali metal silicate treatment is performed on the aforementioned water receptive layer.

Further, it is more preferable that quantity of Si atom adsorbed by this alkali metal silicate treatment is 1.0 to 15 mg/$m^2$.

(6) A presensitized plate provided with an image recording layer on the support for a lithographic printing plate according to any one of (1) to (5) mentioned above.

When the support for a lithographic printing plate according to (5) mentioned above is used, one of the preferable aspects is that the aforementioned image recording layer is a thermosensitive layer that contains a high-molecular compound insoluble in water and soluble in an alkali and a photothermal conversion agent and of which solubility to an alkali aqueous solution is changed by heating.

In addition, when the support for a lithographic printing plate according to (5) mentioned above is used, one of the preferable aspects is that the aforementioned image recording layer includes a lower layer provided on the hydrophilic support and its upper thermosensitive layer, and the thermosensitive layer and/or the lower layer contains a high-molecular material having acid group.

(7) A method of producing a lithographic printing plate by exposing the presensitized plate according to (6) mentioned above and subsequently developing with a developer containing substantially no alkali metal silicate.

As described below, if the support for a lithographic printing plate of the first and second aspects according to the present invention having an feature on its surface shape is used, a balance between scum resistance and press life, which has been in a trade-off relation in the past, can be maintained at a high level.

Particularly, if a support for a lithographic printing plate of the third aspect according to the present invention having a water receptive layer of a specified thermal conductivity is used, a thermosensitive presensitized plate where heat can be efficiently utilized to form an image, the sensitivity is high, it exerts a high press life and a dirt is hardly generated in non-image areas.

DETAILED DESCRIPTION

Figure 1:
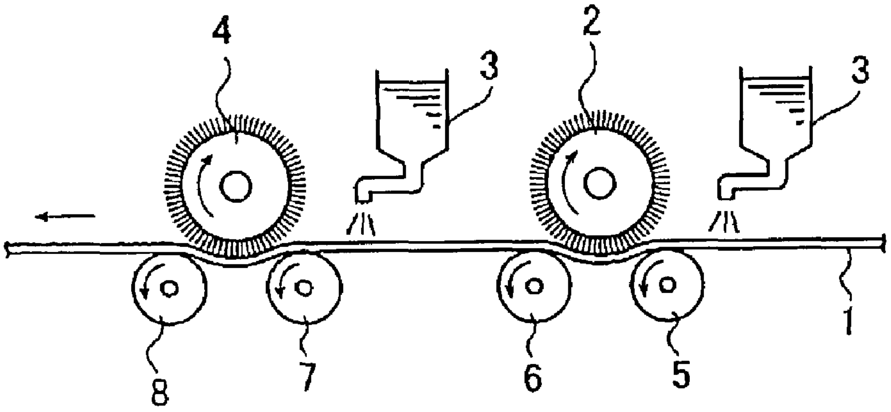
FIG. 1 is a side view showing a concept of a brush graining process used for mechanical graining treatment used in production of a support for a lithographic printing plate according to the present invention.

Hereafter, the present invention will be explained in detail.

[Support for Lithographic Printing Plate]

<Grain Shape on Surface>

A support for a lithographic printing plate according to the first aspect of the present invention is characterized by having, on its surface, a grain shape with a structure in which a grained structure with medium undulation of 0.5 to 5 μm average aperture diameter and a grained structure with small undulation of 0.01 to 0.2 μm average aperture diameter are superimposed.

According to the first aspect of the present invention, a grained structure with medium undulation of 0.5 to 5 μm average aperture diameter has functions of retaining an image recording layer mainly by anchoring effect so as to provide a long press life. If the average aperture diameter of a pit of the grained structure with medium undulation is less than 0.5 μm, press life of the lithographic printing plate may deteriorate due to decrease in contact characteristics with the image recording layer provided as an upper layer. On the other hand, if the average aperture diameter of the pit of the grained structure with medium undulation exceeds 5 μm, press life may deteriorate due to decrease in the number of pit boundary areas playing a role of the anchor.

A grained structure with small undulation of 0.01 to 0.2 μm average aperture diameter superimposed on the aforementioned grained structure with medium undulation mainly plays a role of improving scum resistance. By combining the grained structure with small undulation with the grained structure with medium undulation, when fountain solution is supplied to the lithographic printing plate at the time of printing, a water film is evenly formed on the surface thereof, thereby generation of dirt in non-image areas being suppressed. If the average aperture diameter of the pit of the grained structure with small undulation is less than 0.01 μm, a good effect of water film formation may not be obtained. On the other hand, if the average aperture diameter of the pit of the grained structure with small undulation exceeds 0.2 μm, the aforementioned effect of improving press life by the grained structure with medium undulation may not be obtained since the grained structure with medium undulation is broken.

With regard to the grained structure with small undulation, scum resistance can be further improved by controlling not only the aperture diameter but also a depth of the pit. That is, it is preferable that the ratio of the depth with respect to the aperture diameter of the grained structure with small undulation is 0.2 or more. This reliably allows the evenly formed water film to be retained on the surface and maintain scum resistance on the surface of the non-image areas is maintained for a long period.

The aforementioned structure in which a grained structure with medium undulation and a grained structure with small undulation are superimposed may be a structure where further superimposed by a grained structure with large undulation of 5 to 100 μm average wavelength.

The grained structure with large undulation has an effect of increasing an amount of water retained in the surface of the non-image areas of the lithographic printing plate. The more the water retained is in the surface, the less affected the surface of the non-image areas is by contamination in the atmosphere. This allows obtaining non-image areas that is not easily get dirty even though the printing plate is left as it stands during printing. In addition, if the grained structure with large undulation is superimposed, it is easier to visually inspect an amount of fountain solution supplied to the surface of the printing plate at the time of printing. Namely, inspectability of the lithographic printing plate becomes excellent. If the average wavelength of the grained structure with large undulation is less than 5 μm, there may be no difference from the grained structure with medium undulation. If the average wavelength of the grained structure with large undulation exceeds 100 μm, inspectability of the printing plate may be impaired since the exposed non-image areas appear dazzling after exposure and development. It is preferable that the average wavelength of the grained structure with large undulation is 10 to 80 μm.

In the support for a lithographic printing plate according to the first aspect according to the present invention, following are methods of measuring the average aperture diameter of the grained structure with medium undulation on a surface, the average aperture diameter and the average depths with respect thereto of the grained structure with small undulation, and the average wavelength of the grained structure with large undulation.

(1) Average Aperture Diameter of a Grained Structure with Medium Undulation

The surface of a support is photographed at a magnification of 2,000 from right above with an electron microscope. Next, in an electron micrograph obtained, at least 50 pits of the grained structure with medium undulation (pit of medium undulation) in which circumferences of the pits are annularly connected are extracted, the aperture diameters are determined by reading the diameters of the pits, and an average aperture diameter is calculated. In the case of a structure in which a grained structure with large undulation is superimposed also, measurement is made in the same method as in the above.

In addition, in order to suppress dispersion among measurements, an equivalent circle diameter may be measured with a commercial image analysis software. In this case, the aforementioned electron micrograph is digitized by being scanned with a scanner, and an equivalent circle diameter is found after it is converted into binary values with the software.

The measurement results by the inventors showed that a visual measurement and that of digitization were almost the same value. In the case of a structure in which the grained structure with large undulation are superimposed, a similar result was obtained.

(2) Average Aperture Diameter of a Grained Structure with Small Undulation

The surface of a support for a lithographic printing plate is photographed at a magnification of 50,000 from right above with a high resolution scanning electron microscope (SEM). In a SEM micrograph obtained, at least 50 pits of the grained structure with small undulation (pit of small undulation) are extracted, the aperture diameter is determined by reading the diameters of the pits and an average aperture diameter is calculated.

(3) Average of Ratio of Depth with Respect to the Aperture Diameter of the Grained Structure with Small Undulation The average of ratio of depth with respect to aperture diameter of the grained structure with small undulation is obtained as follows. A broken-out section of a support is photographed at a magnification of 50,000 with a high resolution SEM. In a SEM micrograph obtained, at least 20 pits of small undulation are extracted, the ratios are obtained by reading the aperture diameters and depths, and an average ratio is calculated.

(4) Average Wavelength of a Grained Structure with Large Undulation

A two-dimensional roughness measurement is performed with a stylus type surface roughness gauge, mean spacing of peaks $S_m$ specified in ISO4287 is measured five times, and its mean value is determined to be an average wavelength.

A support for a lithographic printing plate according to the second aspect of the present invention is characterized in that each of $R_a$, ΔS, a30 and a60 obtained from three-dimensional data taken by measuring 50 μm□ area on a surface at 512×512 points with an atomic force microscope meets the following requirements (i) to (iv):

| | |
|---|---|
| (i) $R_a$: | 0.45 μm or more |
| (ii) ΔS: | 30% or more |
| (iii) a30: | 55% or more |
| (iv) a60: | 10% or less. |

As to be described later, $R_a$ indicates a surface roughness obtained by removing components of wavelength 2 μm or longer from the aforementioned three-dimensional data. Specifically, surface roughness $R_a$ indicates the states of asperities on the support surface.

If this $R_a$ is too small, the surface becomes smooth, whereby light easily reflect regularly. As a result, when fountain solution is supplied to the surface of non-image areas in a lithographic printing plate at the time of printing, it is difficult to visually inspect and control an amount of the supplied fountain solution since the surface of a printing plate easily dazzles.

According to the second aspect of the present invention, $R_a$ is set to be relatively large in order to allow easy visual inspection of an amount of the fountain solution supplied to the surface of the printing plate at the time of printing, that is, to make inspectability of the lithographic printing plate excellent. In the second aspect of the present invention, $R_a$ is 0.45 μm or more, and preferably 0.50 μm or more.

As to be described later in detail, ΔS is found by the following equation from an actual area $S_x$ found by the approximation three-point method from the aforementioned three-dimensional data and a geometrically measured area (apparent area) $S_0$:

$$\Delta S=(S_x-S_0)/S_0\times 100(\%)$$

The surface area ratio ΔS is a factor that indicates an extent of increase of the actual area $S_x$ due to graining treatment with respect to the geometrically measured area $S_o$. If ΔS becomes larger, a contact area with an image recording layer becomes larger, resulting in improvement of press life. It is effective to provide a large number of small asperities on the surface in order to increase ΔS. The methods of providing a large number of small asperities on the surface preferably include electrolytic graining treatment with an electrolyte composed mainly by hydrochloric acid, and electrolytic graining treatment with an electrolyte composed mainly by highly concentrated nitric acid at a high temperature. Although ΔS is also increased by mechanical graining treatment or electrolytic graining treatment with an electrolyte mainly composed of ordinary nitric acid, the extent of the increase is small.

According to the second aspect of the present invention, ΔS is 30% or more, and preferably 40% or more.

As to be described later, a30 and a60 indicate an area ratio of an area of gradient 30° or more and an area of gradient 60° or more, respectively, obtained after removing components of wavelength 2 μm or longer from the aforementioned three-dimensional data.

Steepness is a factor that indicates an extent of sharpness of a fine shape on the support surface. Specifically, steepness indicates a ratio of an area having a slant with a given angle or larger with respect to an apparent area in asperities on the support surface. The inventors have variously studied steepness to find out that steepness is correlated with contact characteristics between an image recording layer and a support (i.e. press life), and with ink attachment characteristics in non-image areas (i.e. scum resistance). Particularly, they have found out that press life and scum resistance can be achieved at a high level by balancing two of the steepness based on the specified angles of 30° and 60°.

That is, it is preferable to have a larger area ratio (steepness) a30 of a more gentle slope with gradient 30° or more, in order to give an excellent contact characteristics between the image recording layer and the support, and to improve press life. In addition, a larger a30 is preferable also in order to improve both water receptivity of the non-image areas of the lithographic printing plate and thus scum resistance. According to the second aspect of the present invention, a30 is 55% or more, and preferably 60% or more.

On the other hand, it is preferable to have a smaller area ratio (steepness) a60 of a steeper slope with gradient 60° or more, in order to suppress ink attachment in the non-image areas to improve scum resistance. According to the second aspect of the present invention, a60 is 10% or less, and preferably 7% or less.

In a support for a lithographic printing plate according to the second aspect of the present invention, methods of finding $R_a$, ΔS, a30 and a60 are as follows.

(5) Measurement of Surface Shape with an Atomic Force Microscope

According to the second aspect of the present invention, in order to find $R_a$, ΔS, a30 and a60, surface shapes are measured with an atomic force microscope (AFM) and three-dimensional data are then taken.

Measurement can be performed on the following conditions, for example. That is, 1 cm-square of the support for a lithographic printing plate is cut off, the piece is set on a horizontal sample bench on a piezo scanner, a cantilever is moved closer to the surface of the sample, and when the cantilever reaches an area where an atomic force functions, the sample is scanned in XY directions. While scanning, asperities of the sample are captured as piezo displacement in Z direction. A piezo scanner capable of scanning 150 μm in XY directions and 10 μm in Z direction, respectively, should be used. A cantilever with resonance frequency of 120 to 150 kHz, and spring constant of 12 to 20 N/m (e.g., S1-DF20 made by NANOPROBE Inc.) should be used, and measurement is performed in DFM mode (Dynamic Force Mode). A minor tilting of the sample is corrected by least square approximation method of the three-dimensional data obtained to find a reference plane.

At the time of measurement, a surface in 50 μm□ area is measured at 512×512 points. The resolution in XY directions should be 1.9 μm, the resolution in Z direction should be 1 nm, and scanning rate should be 60 μm/sec.

(6) Correction of Three-dimensional Data

While in the calculation of ΔS, the three-dimensional data found in (5) mentioned above is used as it stands, in calculation of $R_a$, a30 and a60, a data that is corrected by removing components of wavelength 2 μm or longer from the three-dimensional data taken in (5) mentioned above is employed. This correction can remove noises generated by a probe hitting the edge portion of a convex portion and jumping, or by a portion other than an edge of the probe contacting the wall surface of a deep concave portion when a surface with deep asperities as in a support for a lithographic printing plate is scanned with a probe of AFM.

The correction is performed by performing the fast Fourier transform of the three-dimensional data taken in (5) mentioned above to find frequency distribution, and performing inverse Fourier transform after removing components of wavelength 2 μm or longer.

(7) Calculation of Each Factor (i) $R_a$

Surface roughness $R_a$ is calculated by the following equation using the three-dimensional data (f (x, y)) obtained after a correction is performed in (6) mentioned above.

$$R_a = \frac{1}{S_0}\int_0^{Lx}\int_0^{Ly}|f(x, y)|dx \cdot dy$$

In the equation, each of $L_x$ and $L_y$ indicates the length of a side in x direction and y direction of a measured area (rectangle) and their relation is that $L_x=L_y=50$ μm in the second aspect according to the present invention. In addition, $S_o$ is geometrically measured area and is found by an equation that $S_o=L_x \times L_y$.

(ii) ΔS

Adjacent three points are extracted using the three-dimensional data (f (x, y)) found in (5) mentioned above, and the total of areas of fine triangles formed by the three points is found, which is determined to be actual area $S_x$. Surface area ratio ΔS is found by the following equation from the obtained actual area $S_x$ and geometrically measured area $S_0$:

$$\Delta S=(S_x-S_0)/S_0\times 100(\%)$$

(iii) a30 and a60

Using the three-dimensional data (f (x, y)) obtained by correction in (6) mentioned above, an angle made between a reference plane and a fine triangle formed by the three points constituted by each reference point and adjacent two points in predetermined directions (for example, rightwards and downwards) is calculated, for each reference point. The number of reference points at which a gradient of the fine triangle is 30° or more (in the case of a30) or 60° or more (in the case of a60) is divided by the number of all reference points (herein, the number of all reference points is 511×511 points, that is obtained by subtracting the number of points which do not have adjacent two points in the predetermined directions from 512×512 points, that is, the number of all data). Accordingly, an area ratio a30 of a portion of gradient 30° or more and an area ratio a60 of a portion of gradient 60° or more are calculated.

One of the particularly preferred aspects according to the present invention is a support for a lithographic printing plate that satisfies both the first aspect and the second aspect according to the present invention.

<Surface Treatment>

A support for a lithographic printing plate according to the present invention is one that, by performing surface treatment on an aluminum plate to be described later, the aforementioned surface grain shape on a surface is formed on the surface of the aluminum plate. While the support for a lithographic printing plate according to the present invention is obtained by performing at least graining treatment on an aluminum plate, the producing method of the support is not particularly limited and may include various processes other than graining treatment.

As typical methods of forming the aforementioned grain shape on a surface, the following methods will be explained:

a method by sequentially performing mechanical graining treatment, alkali etching treatment, desmutting treatment with an acid, and electrochemical graining treatment with an electrolyte on an aluminum plate;

a method by performing, for several times, mechanical graining treatment, alkali etching treatment, desmutting treatment with an acid, and electrochemical graining treatment with an electrolyte on an aluminum plate;

a method by sequentially performing alkali etching treatment, desmutting treatment with an acid, and electrochemical graining treatment with an electrolyte on an aluminum plate; and a method by performing, for several times, alkali etching treatment, desmutting treatment with an acid, and electrochemical graining treatment with an electrolyte on an aluminum plate. However, according to the present invention, the method is not limited to the above. In these methods, alkali etching treatment and desmutting treatment may be further performed after the electrochemical graining treatment as above is performed.

In addition, graining treatment preferably used so as to allow each of $R_a$, ΔS, a30 and a60 that are the factors to indicate surface shapes according to the second aspect of the present invention to satisfy specified conditions includes a method by sequentially performing mechanical graining treatment, electrochemical graining treatment with an electrolyte mainly composed of nitric acid, and electrochemical graining treatment with an electrolyte mainly composed of hydrochloric acid, although it depends on conditions of other treatment (alkali etching treatment or the like). In addition, the graining treatment also includes a method by performing only electrochemical graining treatment in which the total amount of electricity involved in anodizing reaction is increased with an electrolyte mainly composed of hydrochloric acid.

According to the first aspect and the second aspect of the present invention, one of particularly preferable methods is a method by sequentially performing, on an aluminum plate, mechanical graining treatment, alkali etching treatment, desmutting treatment with an acid, electrochemical graining treatment with an electrolyte containing nitric acid, alkali etching treatment, desmutting treatment with an acid, electrochemical graining treatment with an electrolyte containing hydrochloric acid, alkali etching treatment, and desmutting treatment with an acid.

A support surface for a lithographic printing plate according to the first aspect of the present invention obtained in these methods has a structure in which two or more different profile cycles of asperities are superimposed on the surface thereof, and is excellent in both scum resistance and press life when a lithographic printing plate is made therefrom.

A support for a lithographic printing plate according to the second aspect of the present invention obtained by these methods and in which each of the aforementioned factors indicating a surface shape satisfies the specified requirement, is excellent in both scum resistance and press life when a lithographic printing plate is made therefrom.

Hereafter, each process of surface treatment will be explained in detail.

<Mechanical Graining Treatment>

Mechanical graining treatment is effective means for graining treatment since it is capable of forming a surface with average wavelength 5 to 100 μm asperities at a lower cost than electrochemical graining treatment.

Mechanical graining treatment that can be used includes wire brush graining treatment by scratching an aluminum plate surface with metal wire, ball graining treatment by performing graining on an aluminum plate surface with an abrasive ball and an abrasive agent, and brush graining treatment by performing graining on a surface with a nylon brush and an abrasive agent as described in JP 6-135175 A and JP 50-40047 B.

In addition, a transfer method in which a surface with asperities is pressed onto an aluminum plate can be also employed. That is, applicable methods include those described in JP 55-74898 A, JP 60-36195 A and JP 60-203496 A, as well as a method described in JP 6-55871 A characterized by performing transfer several times, and a method described in JP 6-024168 A characterized in that the surface is elastic.

It is also possible to use a method by repeatedly performing transfer using a transfer roller on which fine asperities are etched with electric discharge machining, shot blast, laser, plasma etching or the like, and a method in which a surface with asperities on which fine particles are applied is allowed to contact with an aluminum plate, pressure is applied on that several times, and transfer of the asperity pattern equivalent to average diameter of fine particles is repeatedly performed on an aluminum plate several times. A method of providing fine asperities to a transfer roll includes methods known to the public, as described in JP 3-8635 A, JP 3-66404 A, JP 63-65017 A or the like. In addition, fine grooves may be engraved on the surface of the transfer roll from two directions with a dice, a turning tool, a laser or the like to form square asperities on the surface. Also, publicly known etching treatment or the like may be performed on the surface of the transfer roll such that the formed square asperities become round.

In addition, hardening, hard chrome plating or the like may be performed to increase hardness of a surface.

Moreover, mechanical graining treatment may include methods as described in JP 61-162351 A, JP 63-104889 A or the like.

In the present invention, each method as above may be used in combination with others, taking productivity or the like into consideration. It is preferable that these mechanical graining treatments are performed before electrochemical graining treatment.

Hereafter, brush graining treatment preferably used as mechanical graining treatment will be explained.

Brush graining treatment generally uses a roller-like brush in which a lot of synthetic resin brushes made of synthetic resin such as nylon (trademark), polypropylene and PVC resin are implanted on the surface of a cylindrical drum, and treatment is performed by scrubbing one or both of the surfaces of the aluminum plate while spraying a slurry containing an abrasive over a rotating roller-like brush. An abrasive roller on which an abrasive layer is provided may be also used in place of the roller-like brush and a slurry.

When a roller-like brush is used, bending elastic modulus is preferably 10,000 to 40,000 kg/cm$^2$, more preferably 15,000 to 35,000 kg/cm$^2$, and a treatment should use a brush with bristle elasticity of, preferably 500 g or less, more preferably 400 g or less. The diameter of the bristle is generally 0.2 to 0.9 mm. While the length of the bristle can be appropriately determined depending on the outer diameter of the roller-like brush and the diameter of the drum, it is generally 10 to 100 mm.

As to an abrasive, a publicly known one may be used. Abrasives that can be used include pumice, silica sand, aluminum hydroxide, alumina powder, silicon carbide, silicon nitride, volcanic ash, carborundum, emery, and mixtures thereof. Pumice and silica sand are preferable among them. Silica sand is particularly preferable because of excellent graining efficiency since it is harder than pumice and is not easily broken compared to pumice.

A preferable average particle diameter of the abrasive is 3 to 50 μm, and more preferably 6 to 45 μm, from the viewpoint of excellent graining efficiency and that graining pitch can be narrowed.

An abrasive is, for example, suspended in water and used as a slurry. Beside abrasives, thickener, dispersant (for example, surfactant), antiseptic agent or the like may be contained in the slurry. It is preferable that the specific gravity of a slurry is 0.5 to 2.

As an apparatus suitable for mechanical graining treatment, for example, includes an apparatus as described in JP 50-40047 B.

<Electrochemical Graining Treatment>

Electrochemical graining treatment may use en electrolyte used for electrochemical graining treatment with an ordinary alternating current. Particularly, a structure of asperities unique to the present invention may be formed on a surface by using an electrolyte mainly composed of hydrochloric acid or nitric acid.

As electrolytic graining according to the present invention, it is preferable that the first and second electrolytic treatments are performed in an acid solution in alternating corrugated current before and after the cathode electrolytic treatment. Hydrogen gas is generated on the surface of an aluminum plate to produce smut by cathode electrolytic treatment, thereby creating an even surface condition. This allows the even graining treatment to be performed at the time of electrolytic treatment by the subsequent alternating corrugated current.

This electrolytic graining treatment can follow the electrochemical graining treatment (electrolytic graining treatment) as described in JP 48-28123 B and GB 896,563, for example. Although this electrolytic graining treatment uses sine waveform alternating current, a special waveform may be used as described in JP 52-58602 A. In addition, a waveform as described in JP 3-79799 A can be also used. Moreover; the methods as described in JP 55-158298 A, JP 56-28898 A, JP 52-58602 A, JP 52-152302 A, JP 54-85802 A, JP 60-190392 A, JP 58-120531 A, JP 63-176187 A, JP 1-5889 A, JP 1-280590 A, JP 1-118489 A, JP 1-148592 A, JP 1-178496 A, JP 1-188315 A, JP 1-154797 A, JP 2-235794 A, JP 3-260100 A, JP 3-253600 A, JP 4-72079 A, JP 4-72098 A, JP 3-267400 A and JP 1-141094 A may also be used. In addition, besides the aforementioned, it is also possible to perform electrolysis using a special frequency alternating current proposed as a method for producing an electrolytic capacitor. It is described for example in U.S. Pat. Nos. 4,276,129 and 4,676,879.

While an electrolytic bath and power supply are variously proposed, those as described in U.S. Pat. No. 4,203,637, JP 56-123400 A, JP 57-59770 A, JP 53-12738 A, JP 53-32821 A, JP 53-32822 A, JP 53-32823 A, JP 55-122896 A, JP 55-132884 A, JP 62-127500 A, JP 1-52100 A, JP 1-52098 A, JP 60-67700 A, JP 1-230800 A, JP 3-257199 A or the like can be used.

In addition, those as described in JP 52-58602 A, JP 52-152302 A, JP 53-12738 A, JP 53-12739 A, JP 53-32821 A, JP 53-32822 A, JP 53-32833 A, JP 53-32824 A, JP 53-32825 A, JP 54-85802 A, JP 55-122896 A, JP 55-132884 A, JP 48-28123 B, JP 51-7081 B, JP 52-133838 A, JP 52-133840 A, JP 52-133844 A, JP 52-133845 A, JP 53-149135 A, JP 54-146234 A or the like can be used.

As an acid solution that is an electrolyte, in addition to nitric acid and hydrochloric acid, the electrolytes as described in U.S. Pat. Nos. 4,671,859, 4,661,219, 4,618,405, 4,600,482, 4,566,960, 4,566,958, 4,566,959, 4,416,972, 4,374,710, 4,336,113 and 4,184,932 or the like can be used.

The concentration of an acid solution should preferably be 0.5 to 2.5 wt %, and it should be particularly preferably 0.7 to 2.0 wt %, taking the use for desmutting treatment into account. In addition, the temperature of a solution should preferably be 20 to 80° C., and should more preferably be 30 to 60° C.

An aqueous solution mainly composed of hydrochloric acid or nitric acid can be used in such a manner that at least one of nitrates having nitrate ion such as aluminum nitrate, sodium nitrate and ammonium nitrate or chlorides having chlorine ion such as aluminum chloride, sodium chloride and ammonium chloride is added in a range from 1 g/L to a saturation point to hydrochloric acid or nitric acid aqueous solution of the concentration 1 to 100 g/L. In addition, metals contained in aluminum alloys such as iron, copper; manganese, nickel, titanium, magnesium and silicon may be dissolved in the aqueous solution mainly composed of hydrochloric acid or nitric acid. It is preferable that a solution in which aluminum chloride, aluminum nitrate and the like are added to an aqueous solution containing hydrochloric acid or nitric acid of the concentration of 0.5 to 2 wt % so as to allow aluminum ion of 3 to 50 g/L to be contained is used.

In addition, it is possible to perform the even graining also on an aluminum plate containing a large amount of copper by adding a compound capable of forming a complex with copper and using it. Compounds capable of forming a complex with copper include ammonia; amines obtained by substituting hydrogen atom in ammonia by hydrocarbon group (aliphatic and aromatic, or the like) or the like, such as methylamine, ethylamine, dimethylamine, diethylamine, trimethylamine, cyclohexylamine, triethanolamine, triisopropanolamine, EDTA (ethylenediaminetetraacetic acid); metal carbonates such as sodium carbonate, potassium carbonate and potassium hydrogencarbonate. Ammonium salts such as ammonium nitrate, ammonium chloride, ammonium sulfate, ammonium phosphate and ammonium carbonate are also included.

The temperature should preferably be 10 to 60° C., and should more preferably be 20 to 50° C.

Figure 2:
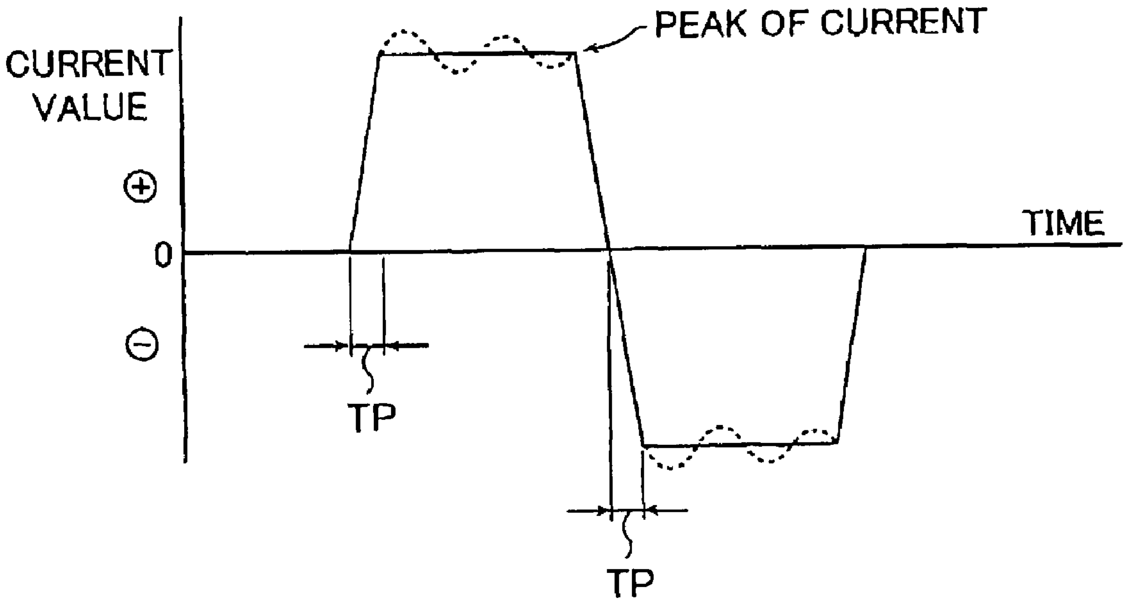
FIG. 2 is a graph showing an example of an trapezoidal current waveform view used for electrochemical graining treatment used in production of a support for a lithographic printing plate according to the present invention.

Alternating current power supply wave used for electrochemical graining treatment is not particularly limited and sine wave, square wave, trapezoidal wave, triangle wave or the like are used. Square wave or trapezoidal wave is preferable, and trapezoidal wave is particularly preferable. Trapezoidal wave is one as shown in FIG. 2. It is preferable that with this trapezoidal wave, a time required for the current to reach a peak from zero (TP) is 1 to 3 msec. If it is less than 1 msec, non-uniformity in treatment called chatter mark is easily generated in a direction perpendicular to a traveling direction of an aluminum plate. If TP exceeds 3 msec, particularly when nitric acid electrolyte is used, an aluminum plate is easily affected by trace components in an electrolyte represented by ammonium ion or the like that spontaneously increase in electrochemical graining treatment, thus the even graining is not easily performed. As a result, scum resistance is likely to deteriorate when a lithographic printing plate is prepared.

Trapezoidal wave alternating current with a duty ratio of 1:2 to 2:1 is usable, and duty ratio should preferably be 1:1 in an indirect power supplying system dispensing with a conductor roll for aluminum as described in JP 5-195300 A.

While trapezoidal wave alternating current with a frequency of 0.1 to 120 Hz is usable, frequency should preferably be 50 to 70 Hz in terms of equipment. If it is lower than 50 Hz, the carbon electrode of a main electrode is easily dissolved, and if it is higher than 70 Hz, it is easily affected by the components of inductance in a power supply circuit, thus an electric power cost increases.

Figure 3:
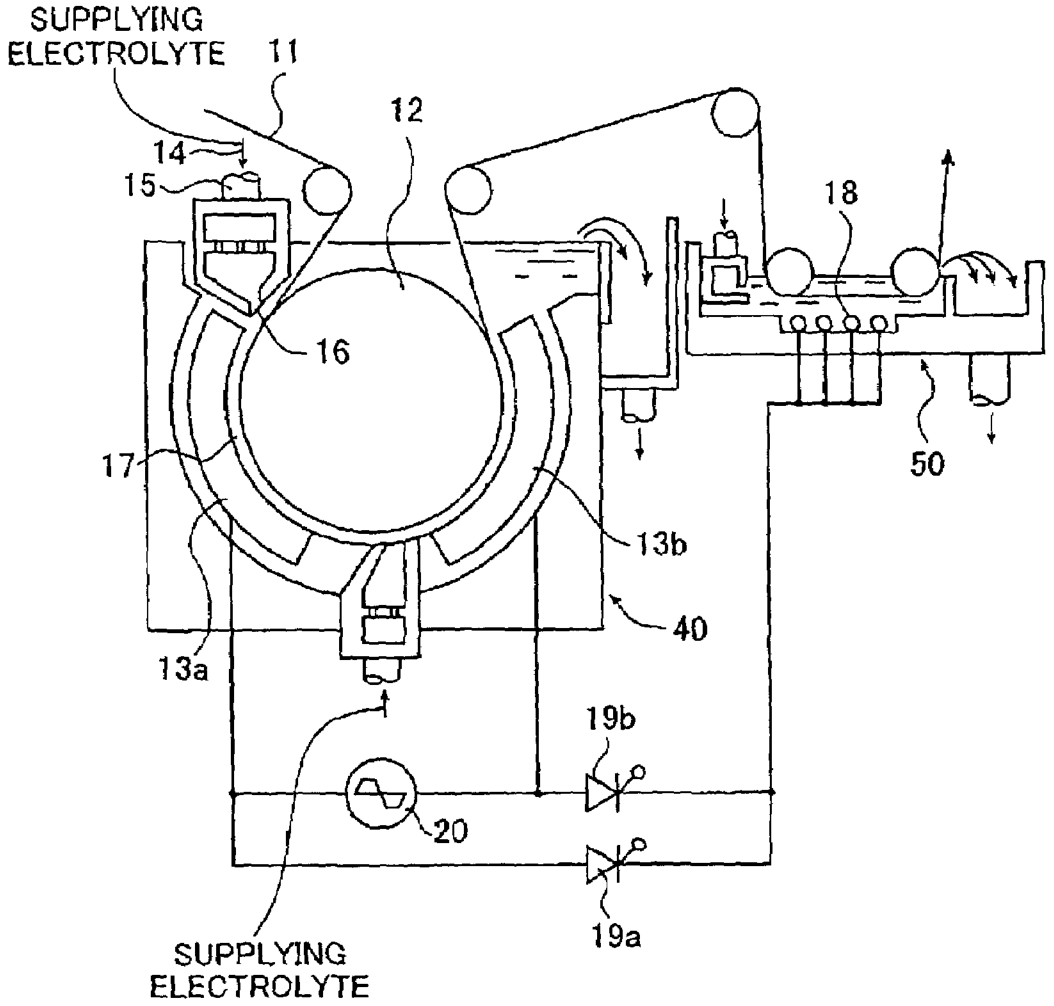
FIG. 3 is a side view showing an example of a radial cell used for electrochemical graining treatment using alternating current used in production of a support for a lithographic printing plate according to the present invention.

One or more alternating current power supplies can be connected to an electrolytic bath. It is preferable that, as shown in FIG. 3, an auxiliary anode is installed and a part of alternating current is shunted, for the purpose of controlling the current ratio at the anode and the cathode of alternating current applied to an aluminum plate opposite to the main electrode so as to perform the even graining and dissolve carbon in the main electrode. In FIG. 3, a reference numeral 11 denotes an aluminum plate, 12 denotes a radial drum roller, 13*a* and 13*b* denote main electrodes, 14 denotes an electrolyte, 15 denotes an electrolyte feed port, 16 denotes a slit, 17 denotes an electrolyte path, 18 denotes an auxiliary anode, 19*a* and 19*b* denote thyristors, 20 denotes an alternating current power supply, 40 denotes a main electrolytic bath, and 50 denotes an auxiliary anodizing bath. By shunting a part of a current value to an auxiliary anode provided in a bath different from the two main electrode baths in the two main electrodes as direct current via a rectifying device or a switching device, the ratio of a current value used for an anodizing reaction with respect to a current value used for a cathodic reaction reacting on the aluminum plate opposite to the main electrode can be controlled. It is preferable that the ratio of amount of electricity (amount of electricity at cathode/amount of electricity at anode) used for an anodizing reaction and a cathodic reaction on the aluminum plate opposite to the main electrode is 0.3 to 0.95.

While an electrolytic bath used for a publicly known surface treatment such as a vertical type, a flat type and a radial type is usable, a radial type electrolytic bath as described in JP 5-195300 A is particularly preferable. The direction of travel of an electrolyte which passes through the electrolytic bath may be parallel with or perpendicular to that of an aluminum web.

(Electrolysis with Nitric Acid)

A pit with average aperture diameter of 0.5 to 5 μm can be formed by performing electrochemical graining treatment using an electrolyte mainly composed of nitric acid. If amount of electricity is, however, relatively large, an electrolytic reaction concentrates to produce a honeycomb pit with an aperture diameter of even more than 5 μm.

In order to obtain graining like this, the total amount of electricity used for the anodizing reaction of the aluminum plate at a time when an electrolytic reaction is completed should preferably be 1 to 1,000 $C/dm^2$, and should more preferably be 50 to 300 $C/dm^2$. It is preferable that current density is 20 to 100 $A/dm^2$ in this case.

If an electrolyte containing nitric acid of a high concentration or a high temperature is used, a grained structure with small undulation of average aperture diameter of 0.2 μm or less can be also formed.

(Electrolysis with Hydrochloric Acid)

Since hydrochloric acid per se has a strong aluminum solvency, it is possible to form micro asperities on its surface by merely applying a little electrolysis thereon. These micro asperities are of average aperture diameter 0.01 to 0.2 μm and are evenly formed on the entire surface of the aluminum plate. In order to obtain graining like this, the total amount of electricity used for the anodizing reaction of an aluminum plate at a time when an electrolytic reaction is completed should preferably be 1 to 100 $C/dm^2$, more preferably be 20 to 70 $C/dm^2$. It is preferable that current density is 20 to 50 $A/dm^2$ in this case.

It is also possible to simultaneously form a crater-like large undulation by increasing the total amount of electricity used for an anodizing reaction to 400 to 1,000 $C/dm^2$ in electrochemical graining treatment with an electrolyte mainly composed of hydrochloric acid like this. In this case, micro asperities of average aperture diameter 0.01 to 0.4 μm are formed on the entire surface, being superimposed on a crater-like large undulation of average aperture diameter 10 to 30 μm. Therefore, since a grained structure with medium undulation of average aperture diameter 0.5 to 5 μm can not be superimposed thereon in this case, the graining of a surface that is the characteristic of the first aspect according to the present invention can not be produced. It might be possible, however, that each factor of the second aspect according to the present invention satisfies the specified conditions, respectively.

It is preferable that in the present invention, electrolytic graining treatment with an electrolyte mainly composed of nitric acid (electrolysis with nitric acid) as mentioned above is performed as the first electrolytic graining treatment, and electrolytic graining treatment with an electrolyte mainly composed of hydrochloric acid (electrolysis with hydrochloric acid) as mentioned above is performed as the second electrochemical graining treatment. That is, the present invention also provides a method of producing a support for a lithographic printing plate by sequentially performing electrolysis with nitric acid and electrolysis with hydrochloric acid on at least an aluminum plate as graining treatment, and further performing anodizing treatment.

It is preferable that cathode electrolytic treatment is performed on the aluminum plate between the first and the second electrolytic graining treatments in electrolyte containing nitric acid, hydrochloric acid or the like, as mentioned above. This cathode electrolytic treatment allows smut to be produced on the surface of the aluminum plate and hydrogen gas to be generated, and thus electrolytic graining treatment can be more evenly performed. This cathodic electrolytic treatment is performed with cathodic amount of electricity preferably 3 to 80 $C/dm^2$ in an acid solution, and more preferably 5 to 30 $C/dm^2$. If cathodic amount of electricity is less than 3 $C/dm^2$, an amount of attached smut may be insufficient, and if it exceeds 80 $C/dm^2$, an amount of attached smut may be too excessive. Both cases are not preferable. In addition, the cathodic electrolytic treatment may use the same electrolytes used for the first and second electrolytic graining treatments, or a different electrolyte.

<Alkali Etching Treatment>

Alkali etching treatment is a treatment that dissolves a surface layer of the aforementioned aluminum plate by allowing the aluminum plate to contact with an alkali solution.

Alkali etching treatment performed before electrolytic graining treatment is performed to remove rolling oil, dirt, naturally oxidized layer or the like on the surface of the aluminum plate (rolled aluminum) if mechanical graining treatment is not performed thereon, and is performed to dissolve edge portions of asperities generated by mechanical graining treatment to change steeper asperities on the surface to a smoother surge surface if mechanical graining treatment has been already performed.

If mechanical graining treatment is not performed before alkali etching treatment, an amount of etching should preferably be 0.1 to 10 $g/m^2$, and more preferably be 1 to 5 $g/m^2$. If an amount of etching is less than 0.1 $g/m^2$, pits can not be formed evenly to produce non-uniformity in electrolytic graining treatment to be performed later since rolling oil, dirt, naturally oxidized layer or the like may be left on the surface of a plate. On the other hand, if an amount of etching is 1 to 10 $g/m^2$, rolling oil, dirt, naturally oxidized layer and the like are fully removed from the surface of a plate. If an amount of etching exceeds that range, it is less economical.

If mechanical graining treatment is performed before alkali etching treatment, an amount of etching should preferably be 3 to 20 $g/m^2$, and more preferably be 5 to 15 $g/m^2$. If an amount of etching is less than 3 $g/m^2$, the asperities formed by mechanical graining treatment or the like may not be sometimes smoothed, and pits can not be evenly formed in electrolytic treatment to be performed later. In addition, dirt may deteriorate during printing. On the other hand, if an amount of etching exceeds 20 $g/m^2$, asperities structure will disappear.

Alkali etching treatment just after electrolytic graining treatment is performed to dissolve smut produced in an acid electrolyte and to dissolve edge portions of pits formed by electrolytic graining treatment.

An optimum amount of etching varies since a pit formed by electrolytic graining treatment varies according to the kind of an electrolyte. However, it is preferable that an amount of etching in alkali etching treatment after electrolytic graining treatment is 0.1 to 5 $g/m^2$. If a nitric acid electrolyte is used, it is necessary to set an amount of etching to a greater amount than that of the case a hydrochloric acid electrolyte is used.

If electrolytic graining treatment is performed several times, alkali etching treatment can be performed after each electrolytic graining treatment as required.

Alkali used for an alkali solution includes, for example, caustic alkali and alkali metal salts. More specifically, it includes sodium hydroxide and potassium hydroxide. In addition, it includes silicates of alkali metals such as sodium metasilicate, sodium silicate, potassium metasilicate, potassium silicate; carbonates of alkali metals such as sodium carbonate and potassium carbonate; aluminates of alkali metals such as sodium aluminate and potassium aluminate; aldonates of alkali metals such as sodium gluconates and potassium gluconates; hydrogenphosphates of alkali metals such as disodium hydrogen phosphate, dipotassium hydrogen phosphate, sodium dihydrogenphosphate and potassium dihydrogenphosphate. Among them a caustic alkali solution and a solution containing both a caustic alkali and aluminate of alkali metal are preferable from a viewpoint that the rate of etching is fast and costs are lower. Particularly, an aqueous solution of sodium hydroxide is preferable.

The concentration of an alkali solution can be determined in accordance with an amount of etching, and it should preferably be 1 to 50 wt %, more preferably be 10 to 35 wt %. If aluminum ion is dissolved in an alkali aqueous solution, the concentration of aluminum ion should preferably be 0.01 to 10 wt %, more preferably be 3 to 8 wt %. It is preferable that the temperature of an alkali aqueous solution is 20 to 90° C., and treatment time is 1 to 120 seconds.

Methods of allowing an aluminum plate to contact with an alkali solution include, for example, a method by allowing an aluminum plate to pass through a bath containing an alkali solution, a method by allowing an aluminum plate to be immersed in a bath containing an alkali solution, and a method by spraying an alkali solution over the surface of an aluminum plate.

<Desmutting Treatment>

After electrolytic graining treatment or alkali etching treatment is performed, pickling (desmutting treatment) is performed to remove dirt (smut) left on the surface of a plate. Acids that are used include nitric acid, sulfuric acid, phosphoric acid, chromic acid, hydrofluoric acid, borofluoric acid or the like.

The desmutting treatment is performed by allowing the aluminum plate to contact with an acid solution of concentration 0.5 to 30 wt %o of hydrochloric acid, nitric acid, sulfuric acid or the like (aluminum ion 0.01 to 5 wt % contained). A method of allowing an aluminum plate to contact with an acid solution include, for example, a method by allowing an aluminum plate to pass through a bath containing an acid solution, a method by allowing an aluminum plate to be immersed in a bath containing an acid solution, and a method by spraying an acid solution over the surface of an aluminum plate.

In desmutting treatment, an acid solution that can be used includes a wastewater of an aqueous solution mainly containing nitric acid or an aqueous solution mainly containing hydrochloric acid discharged in the electrolytic treatment described above, or a wastewater of an aqueous solution mainly containing sulfuric acid discharged in anodizing treatment described later.

It is preferable that a solution temperature of desmutting is 25 to 90° C. It is preferable that a treatment time is 1 to 180 seconds. Aluminum and aluminum alloy components may be dissolved in an acid solution used for desmutting treatment.

<Formation of Water Receptive Layer>

It is preferable that an aluminum plate on which graining treatment and, as required, other treatments are performed as mentioned above is provided with a water receptive layer of low thermal conductivity.

The diffusion of a heat generated by the exposure with a laser beam into a support can be suppressed by setting the thermal conductivity in the layer thickness direction of a water receptive layer at 0.05 to 0.5 W/(m·K). Since the lower the thermal conductivity is, the higher the suppressing effect of thermal diffusion is, the thermal conductivity should more preferably be 0.08 to 0.3 W/(m·K) and, particularly preferably, 0.2 W/(m·K) or less.

By providing a layer of low thermal conductivity like this, in a presensitized plate called a heat mode type which forms an image utilizing a heat, a sensitivity increases at the time of exposure. No layers are left in a case of a positive type, and image formability is improved in a case of a negative type.

Hereafter, thermal conductivity in the layer thickness direction of a water receptive layer as specified in the third aspect according to the present invention.

Various methods of measuring the thermal conductivity of a thin layer have been reported to date. In 1986, Ono et al. reported the thermal conductivity in the direction of plane of a thin layer by use of a thermograph. In addition, there is also reported a trial that an alternating current heating method is applied to measure thermal properties of a thin layer. While the origin of alternating current heating method can trace back to a report in 1863, in recent years, various measurement methods have been proposed due to development of heating by laser and combinations with Fourier transform. An equipment with laser angstrom method is actually commercialized. Each of these methods finds the thermal conductivity of a direction in plane (inplane direction).

However, a thermal diffusion in a depth direction is rather a vital factor when considering the thermal conduction of a thin layer. As variously reported, it is said that the thermal conductivity of a thin layer is not isotropic, and particularly in a case like the present invention, it is extremely important to directly measure the thermal conductivity in the layer thickness direction. As a trial to measure thermophysical properties of a layer thickness direction of a thin layer from the view point like this, a method using a thermocomparator is reported in a treatise published by Lambropoulos et al. (J. Appl. Phys., 66 (9)(1 Nov. 1989)) and a treatise published by Henager et al. (APPLIED OPTICS, Vol. 32, No.1 (1 Jan. 1993)). In addition, Hashimoto et al. recently reported a method of measuring thermal diffusivity of a thin polymer layer by an analysis using temperature wave for Fourier transform thermal analysis (Netsu Sokutei, 27 (3) (2000)).

The thermal conductivity in a layer thickness direction of a water receptive layer as defined in the present invention is measured with a method using the aforementioned thermocomparator. The method is concretely described below. The basic principle of the method is described in detail in the treatise published by Lambropoulos et al. and the treatise published by Henager et al. as aforementioned. In addition, equipment used for the method is not limited to the following equipment.

Figure 5:
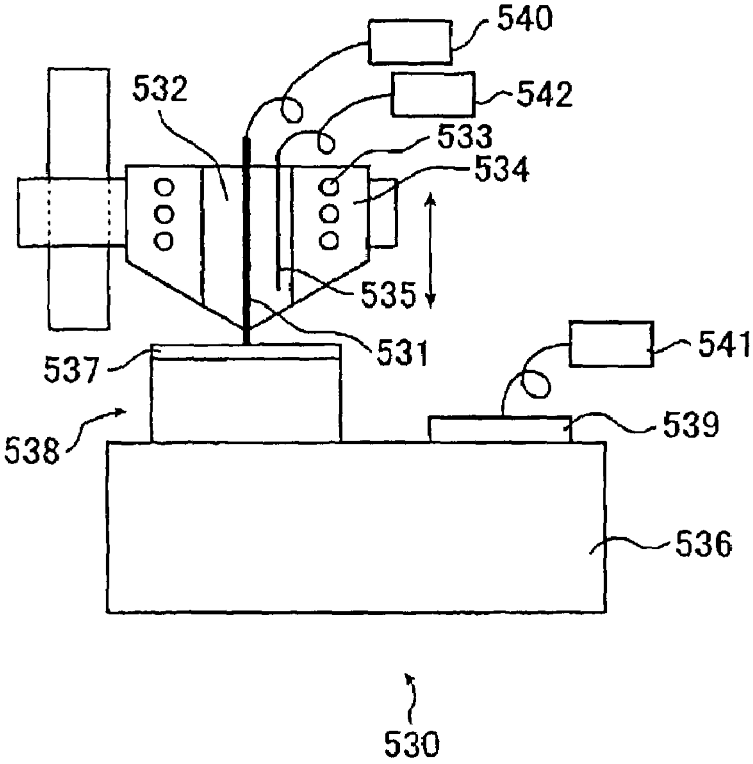
FIG. 5 is a schematic view of a thermocomparator that can be used to measure the thermal conductivity in a layer thickness direction of the water receptive layer of a support for a lithographic printing plate according to the present invention.

FIG. 5 is a schematic view of a thermocomparator 530 that can be used to measure the thermal conductivity in a layer thickness direction of the water receptive layer of a support for a lithographic printing plate according to the present invention. As shown in FIG. 5, reference numeral 530 denotes a thermocomparator, reference numeral 531 denotes a chip, reference numeral 532 denotes a reservoir, reference numeral 533 denotes an electric heater, reference numeral 534 denotes a heating jacket, reference numeral 535 denotes a thermocouple, reference numeral 536 denotes a heat sink, reference numeral 537 denotes a layer, reference numeral 538 denotes a metal substrate, reference numeral 539 denotes a contact thermometer, reference numeral 540 denotes a chip tip thermograph, reference numeral 541 denotes heat sink thermograph, and reference numeral 542 denotes a reservoir thermograph.

In a method using a thermocomparator, a measurement is largely affected by a contact area with a thin layer and the condition (i.e. roughness) of a contact surface. For that reason, it is essential that the tip of thermocomparator 530 that contacts with the thin layer should be as fine as possible. For example, a chip (wire) 531 having a fine tip of radius $r_1$=0.2 mm made of oxygen-free copper is used.

This chip 531 is fixed in place at the center of the reservoir 532 made of constantan and a heating jacket 534 made of oxygen-free copper having an electric heater 533 is fixed in place around the reservoir 532. If this heating jacket 534 is heated by the electric heater 533 and reservoir 532 is so controlled as to be at 60±1° C. while an output of the thermocouple 535 mounted inside the reservoir 532 is fed back, the chip 531 is heated to 60±1° C. On the other hand, a heat sink 536 made of oxygen-free copper of radius 10 cm and thickness 10 mm is prepared and the metal substrate 538 having the layer 537 to be measured is mounted on the heat sink 536. The surface temperature of the heat sink 536 is measured with the contact thermometer 539.

After the thermocomparator 530 is set up like this, a tip of the heated chip 531 is allowed to contact with the surface of layer 537. The thermocomparator 530 is, for example, mounted at the tip of a dynamic microhardness meter in place of an indenter so as to be driven up and down, and is allowed to be pressed until the chip 531 hits the surface of the layer 537 and a 0.5 mN load is applied. This allows variation in a contact area between the layer 537 to be measured and the chip 531 to be minimized.

If the heated chip 531 is allowed to contact with the layer 537, the tip temperature of the chip 531 drops but reaches to a stationary state at a specific constant temperature. This is because a heat quantity given to the chip 531 via the heating jacket 534 and the reservoir 532 from the electric heater 533 and a heat quantity diffused into the heat sink 536 via the metal substrate 538 from the chip 531 are equilibrated. In this case, the chip tip thermograph 540 records the tip temperatures of chip, the heat sink thermograph 541 records the temperature of the heat sink and the reservoir thermograph 542 records the temperature of the reservoir, respectively.

The relationship between each temperature as aforementioned and the thermal conductivity of the layer is described in the following equation [1]:

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad [1]$$

Here, the symbols express the following:

$T_t$: Tip temperature of chip, $T_b$: Heat sink temperature, $T_r$: Reservoir temperature, $K_{tf}$: Layer thermal conductivity, $K_1$: Thermal conductivity of reservoir, $K_2$: Thermal conductivity of chip (in case of oxygen-free copper, 400 W/(m·K)), $K_4$: Thermal conductivity of metal substrate (in case no layer is provided), $r_1$: Radius of curvature of tip of chip, $A_2$: Contact area between the reservoir and the chip, $A_3$: Contact area between the chip and the layer, t: Layer thickness, $t_2$: Contact thickness (≈0).

The gradient of the equation [1] is found by measuring each temperature ($T_t$, $T_b$, and $T_r$) while changing the layer thickness (t) to and plotting them, and the thermal conductivity of a layer ($K_{tf}$) can be found. That is, as is clear from the equation [1], this gradient is a value that is determined by reservoir thermal conductivity ($K_1$), radius of curvature of tip of chip ($r_1$), layer thermal conductivity ($K_{tf}$) and contact area ($A_3$) between the chip and the layer. Since $K_1$, $r_1$ and $A_3$ are already known values, a value of $K_{tf}$ can be found from the gradient.

The inventors have found thermal conductivity of an anodized layer ($Al_2O_3$) provided on an aluminum plate with the measuring method as above. The thermal conductivity of $Al_2O_3$ found from the gradient of the graph made from the results of measuring each temperature of the layer while changing the thickness thereof is 0.69 W/(m·K)). This well agrees with the results as described in the treatise published by Lambropoulos et al. as aforementioned. In addition, this result also indicates that the value of thermal property of the thin layer is different from that of bulk (thermal conductivity of bulk $Al_2O_3$ is 28 W/(m·K)).

It is preferable to use a method of measuring the thermal conductivity in a layer thickness direction of a water receptive layer in a presensitized plate according to the present invention, because a result without variation for even the surface on which graining is performed for a lithographic printing plate can be obtained by using a fine tip of a chip and keeping a pressing load constant. It is preferable that the value of a thermal conductivity is found as the average value of values measured at different several points, for example, at 5 points on a sample.

The thickness of a water receptive layer should preferably be 0.1 μm or more from the view point of scratch resistance and press life, and more preferably be 0.3 μm or more, and particularly preferably be 0.6 μm or more. In addition, it should preferably be 5 μm or less, more preferably be 3 μm or less, and particularly preferably be 2 μm or less in terms of the manufacturing cost since a large energy is required to provide a thicker layer.

A method of providing a water receptive layer is not particularly limited, methods that can be used as appropriately include anodizing method, evaporation method, CVD method, sol-gel method, sputtering method, ion plating method, diffusion method and the like. In addition, a method by applying a solution in which hollow particles mixed in a hydrophilic resin or a sol-gel liquid can be used.

Among those, it is preferable that a layer of highly hydrophilic aluminum oxide is formed by anodizing an aluminum plate surface. A layer obtained is of hydrophilic and has a high hardness, thereby allowing the surface of a support to increase its abrasion resistance. Since it has a high-speed treatment suitability, a high productivity can be obtained.

Anodizing treatment can be performed in the same method as in a method conventionally performed in this field of technology. Concretely, if direct current or alternating current is allowed to flow in an aluminum plate in an aqueous solution or a non-aqueous solution containing a single or two or more kinds of sulfuric acid in combination, phosphoric acid, chromic acid, oxalic acid, sulfamic acid, benzenesulfonic acid or the like, an anodized layer that is a water receptive layer can be formed on the surface of an aluminum plate.

In this case, components normally contained in an aluminum plate, an electrode, city water, an underground water or the like may be contained in an electrolyte. A second and a third components may be further added thereto. The second and third components for example may include metal ions such as Na, K, Mg, Li, Ca, Ti, Al, V, Cr, Mn, Fe, Co, Ni, Cu and Zn; cation such as ammonium ion; anion such as nitrate ion, carbonate ion, chloride ion, phosphate ion, fluoride ion, sulfite ion, titanate ion, silicate ion and borate ion. Each of them may be contained in the concentration of approximately 0 to 10,000 ppm in an electrolyte.

Although the conditions of anodizing treatment can not be indiscriminately determined since they are variously changed according to an electrolyte to be used, generally appropriate conditions are the concentration of an electrolyte: 1 to 80 wt %, the temperature of an electrolyte: 5 to 70° C., the current density: 0.5 to 60 A/dm$^2$, the voltage: 1 to 100 V and the time of electrolysis: 15 seconds to 50 minutes and they are so controlled as to produce the desired amount of an anodized layer. In addition, the methods as described in JP 54-81133 A, JP 57-47894 A, JP 57-51289 A, JP 57-51290 A, JP 57-54300 A, JP 57-136596 A, JP 58-107498 A, JP 60-200256 A, JP 62-136596 A, JP 63-176494 A, JP 4-176897 A, JP 4-280997 A, JP 6-207299 A, JP 5-24377 A, JP 5-32083 A, JP 5-125597 A, JP 5-195291 A or the like may be used.

It is preferable that a sulfuric acid solution is used as an electrolyte as described in JP 54-12853 A and JP 48-45303 A among others. It is preferable that the concentration of sulfuric acid in an electrolyte is 10 to 300 g/L (1 to 30 wt %). In addition, the concentration of aluminum ion should preferably be 1 to 25 g/L (0.1 to 2.5 wt %), and more preferably be 2 to 10 g/L (0.2 to 1 wt %). An electrolyte like this can be prepared by adding aluminum sulfate or the like to a diluted sulfuric acid of concentration 50 to 200 g/L, for example.

If anodizing treatment is performed in an electrolyte containing sulfuric acid, either of direct current or alternating current can be impressed in-between an aluminum plate and an opposite pole.

If direct current is impressed to an aluminum plate, the current density should preferably be 1 to 60 A/dm$^2$, and more preferably to be 5 to 40 A/dm$^2$.

If anodizing treatment is continuously performed, it is preferable that in order to prevent so-called "burning" caused by concentration of current on a part of an aluminum plate, current with low current density of 5 to 10 A/$dm^2$ be allowed to flow at the beginning of anodizing treatment and the current density be increased to 30 to 50 A/$dm^2$ or higher while anodizing treatment progresses.

It is preferable that if anodizing treatment is continuously performed, the treatment is performed by an electric power supplying system via solution, in which electric power is supplied to an aluminum plate through an electrolyte.

A porous layer having many holes called pore (micropore) is obtained by performing anodizing treatment under the conditions like this. Generally, its average pore diameter is about 5 to 50 nm, and its average pore density is about 300 to 800 pcs/$\mu m^2$.

Among these anodizing treatments, the method of performing anodizing treatment at a high current density in a sulfuric acid electrolyte as described in GB 1,412,768 and the method of performing anodizing treatment in phosphoric acid as an electrolytic as described in U.S. Pat. No. 3,511,661 are preferable. In addition, a multi-stage anodizing treatment in which anodizing treatment is performed in sulfuric acid and subsequent anodizing treatment in phosphoric acid and the like may be performed.

In the present invention, an anodized layer should preferably be of 0.1 g/$m^2$ or more from the view point of scratch resistance and press life, more preferably be 0.3 g/$m^2$ or more, and particularly preferably 2 g/$m^2$ or more. In addition, since a large amount of energy is required to provide a thicker layer, it should preferably be 100 g/$m^2$ or less, more preferably be 40 g/$m^2$ or less, and particularly preferably be 20 g/$m^2$ or less.

Generally, a layer of 4 g/$m^2$ is equivalent to that of about 1 μm thickness.

Device for electrolysis as described in JP 48-26638 A, JP 47-18739 A, JP 58-24517 B or the like may be used for anodizing treatment.

Figure 4:
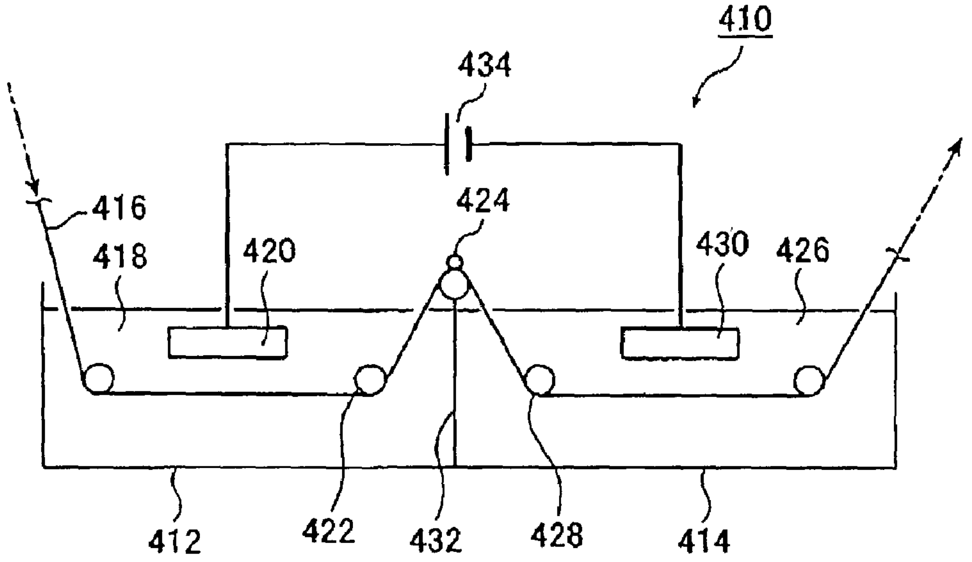
FIG. 4 is a schematic view of an anodizing device used for anodizing treatment used in production of a support for a lithographic printing plate according to the present invention.

Among those, device as shown in FIG. 4 is preferably used. FIG. 4 is a schematic view that shows one example of device which performs anodizing treatment on an aluminum plate surface. In anodizing device 410, an aluminum plate 416 is transferred as shown by an arrow in FIG. 4. The aluminum plate 416 is positively charged by a feeding electrode 420 in a feeding bath 412 where an electrolyte 418 is stored. Then, after the aluminum plate 416 is transferred upward by a roller 422 in the feeding bath 412 and the direction of the transfer is changed downward by a nip roller 424, the plate is transferred to an electrolytic cell 414 where an electrolyte 426 is stored and the direction of the plate is changed to a horizontal direction by a roller 428. Thereafter, an anodized layer is formed on the surface of the aluminum plate 416 by negatively charging the plate with an electrolytic electrode 430, and the aluminum plate 416 coming out of the electrolytic cell 414 is transferred to a following process. In the anodizing treatment device 410, direction changeover means is composed of the roller 422, the nip roller 424, and the roller 428. The aluminum plate 416 is transferred in a mountain shape and a reversed U shape between the feeding bath 412 and the electrolytic cell 414 by the rollers 422, 424 and 428. The feeding electrode 420 and the electrolytic electrode 430 are connected to a direct current power supply 434.

The anodizing device 410 as shown in FIG. 4 is characterized by the feeding bath 412 and the electrolytic cell 414 partitioned with a bath wall 432, and transferring the aluminum plate 416 in a mountain shape and in a reversed U shape between the baths, thereby length of the aluminum plate 416 between the baths can be made to the shortest. Consequently, since the entire length of the anodizing device 410 can be shortened, the cost of equipment can be reduced. In addition, since the aluminum plate 416 is transferred in a mountain shape and a reversed U shape, the necessity of forming an aperture in the bath walls of each of the baths 412 and 414, through which the aluminum plate 416 is allowed to pass, is eliminated. Therefore, an amount of a supplied solution required to keep a solution level at a predetermined level in each bath 412 and 414 can be reduced, so that the operation cost can be reduced.

Micro recesses called micropores are evenly formed on the surface of the anodized layer. The density of micropores existent in the anodized layer can be adjusted by selecting the treatment conditions appropriately. Thermal conductivity in a layer thickness direction of the anodized layer can be set at 0.05 to 0.5 W/(m·K) by increasing the density of a micropore.

In the third aspect according to the present invention, it is preferable that after anodizing treatment is performed, pore widening treatment to widen the pore diameter of the micropore is performed to lower thermal conductivity. That is, this pore widening treatment dissolves the anodized layer to expand the pore diameter by dipping the aluminum plate on which the anodized layer is formed in an acid aqueous solution or an alkali aqueous solution. In performing pore widening treatment, a dissolved amount of the anodized layer should preferably be 0.01 to 20 g/$m^2$, more preferably be 0.1 to 5 g/$m^2$, and particularly preferably be 0.2 to 4 g/$m^2$.

When an acid aqueous solution is used for pore widening treatment, it is preferable that, inorganic acids such as sulfuric acid, phosphoric acid, nitric acid, hydrochloric acid or an aqueous solution of mixture of these are used. The concentration of the acid aqueous solution should preferably be 10 to 1,000 g/L, and more preferably be 20 to 500 g/L. The temperature of the acid aqueous solution should preferably be 10 to 90° C., and more preferably be 30 to 70° C. The time for dipping into the acid aqueous solution should preferably be 1 to 300 seconds, and more preferably be 2 to 100 seconds.

On the other hand, if an alkali aqueous solution is used for pore widening treatment, it is preferable that at least an alkali aqueous solution selected from a group consisting of sodium hydroxide, potassium hydroxide and lithium hydroxide is used. The pH of an alkali aqueous solution is preferably be 10 to 13, and more preferably be 11.5 to 13.0. The temperature of the alkali aqueous solution should preferably be 10 to 90° C., and more preferably be 30 to 50° C. The time for dipping into the alkali aqueous solution should preferably be 1 to 500 seconds, and more preferably to 2 to 100 seconds.

In addition to the aforementioned anodized layer, the water receptive layer may be an inorganic layer provided by sputtering method, CVD method or the like. The compounds constituting an inorganic layer may include oxide, nitride, silicate, borate and carbide. Further, the inorganic layer may be composed of either only a single compound or a mixture of compounds.

The compounds constituting an inorganic layer may concretely include aluminum oxide, silicon oxide, titanium oxide, zirconium oxide, hafnium oxide, vanadium oxide, niobium oxide, tantalum oxide, molybdenum oxide, tungsten oxide, chromium oxide; aluminum nitride, silicon nitride, titanium nitride, zirconium nitride, hafnium nitride, vanadium nitride, niobium nitride, tantalum nitride, molybdenum nitride, tungsten nitride, chromium nitride, boron nitride; titanium silicide, zirconium silicide, hafnium silicide, vanadium silicide, niobium silicide, tantalum silicide, molybdenum silicide, tungsten silicide, chromium silicide;

titanium boride, zirconium boride, hafnium boride, vanadium boride, niobium boride, tantalum boride, molybdenum boride, tungsten boride, chromium boride; aluminum carbide, silicon carbide, titanium carbide, zirconium carbide, hafnium carbide, vanadium carbide, niobium carbide, tantalum carbide, molybdenum carbide, tungsten carbide and chromium carbide.

One of the preferred forms of the water receptive layer is either having the density of 1,000 to 3,200 kg/$M^2$, or porosity of 20 to 70%.

In addition, in order to form a layer of a low density and excellent heat insulation on an aluminum plate, treatment with glasses such as silica, soda glass and borosilicate glass and the aforementioned anodized layer formation treatment are preferably used. Among them, anodizing treatment can form a micropore to be a predetermined porosity by selecting the conditions of anodizing treatment. This treatment is preferred from the view point that a desired low-density layer can easily be formed by controlling the volume of micropores according to the conditions of anodizing treatment and of subsequent treatments.

As a concrete method of controlling the density of a layer, by performing anodizing treatment for a long period of time while keeping the current density low, many fine vacancies are formed and a good-quality, low-density layer is likely to be formed. In addition, it is known that if the temperature or the concentration of an electrolyte is increased, the diameter of the hole formed on the surface of the anodized layer is likely to be increased. A layer with a desired density may be formed by combining the aforementioned method with sealing treatment to be described later. In addition, a method of dissolving micropores with an acid solution or an alkali solution after anodizing treatment may be used so as to make the once formed anodized layer in be a low-density layer. Moreover, these controlling methods may be appropriately selected by those skilled in the art.

A low-density layer is formed under the aforementioned conditions. The density of the formed layer can be found by, for example, the following equation from the weight measurement by Mason method (a method of measuring weight of an anodized layer by dissolving the layer in a mixture of chromic acid and phosphoric acid) and the thickness of the layer found by observing the cross section of the layer with SEM:

Density (kg/$m^3$)=(weight of layer per unit area/thickness of layer)

If the density of the formed layer is less than 1,000 kg/$m^3$, the strength of the layer may become weak, thereby badly affecting image forming characteristics and press life, and if the density exceeds 3,200 kg/$m^3$, sufficient heat insulation can not be obtained, thereby decreasing a sensitivity-improving effect.

Porosity of a water receptive layer should preferably be 20 to 70%, more preferably be 30 to 60%, and particularly preferably be 40 to 50%. If the porosity of a water receptive layer is 20% or more, thermal diffusion into a support is sufficiently suppressed and a sensitivity-improving effect can be sufficiently obtained. If the porosity of a water receptive layer is 70% or less, a problem that dirt is generated in non-image areas does not easily take place.

The porosity of a water receptive layer here means a volume ratio of an area of holes in the layer. In the case of an anodized layer, the porosity can be found from a pore diameter, depth, and number of pores obtained by SEM observation.

After a layer with a density 1,000 to 3,200 kg/$m^3$ is produced, sealing treatment to be described later is performed to increase the surface area of a support one to thirty times of the apparent surface area. The apparent surface area here is, for example, an area of 10,000 $mm^2$ if graining treatment and anodizing treatment are performed on only one side of a printing plate of 100 mm×100 mm, and an area of 20,000 $mm^2$ if graining treatment and anodizing treatment are performed on both sides of the printing plate, the both sides being used as the printing plate.

<Sealing Treatment>

In the present invention, sealing treatment for sealing micropores existent in the anodized layer may be performed as required. Sealing treatment may be performed according to the publicly known methods such as boiling water treatment, hot water treatment, steaming treatment, sodium silicate treatment, nitrite treatment and ammonium acetate treatment. The sealing treatment may be performed with the device and by the methods as described in JP 56-12518 B, JP 4-4194 A, JP 5-202496 A, JP 5-179482 A or the like, for example.

<Treatment for Water Wettability>

Treatment for water wettability may be performed after anodizing treatment or sealing treatment is performed. Treatments for water wettability include potassium fluorozirconate treatment as described in U.S. Pat. No. 2,946,636, phosphomolybdate treatment as described in U.S. Pat. No. 3,201,247, alkyltitanate treatment as described in GB 1,108,559, polyacrylic acid treatment as described in DE 1,091,433, polyvinylphosphonic acid treatment as described in DE 1,134,093 and GB 1,230,447, phosphonic acid treatment as described in JP 44-6409 B, phytic acid treatment as described in U.S. Pat. No. 3,307,951, treatment with a salt of lipophilic organic high-molecular compound and divalent metal as described in JP 58-16893 A and JP 58-18291 A, treatment providing undercoat layer of hydrophilic cellulose (for example, carboxylmethylcellulose) containing water-soluble metallic salts (for example, zinc acetate) as described in U.S. Pat. No. 3,860,426 and treatment to apply undercoating of water-soluble polymer having sulfo group as described in JP 59-101651 A.

In addition, compounds used for undercoating treatment include phosphate as described in JP 62-019494 A, water-soluble epoxide compound as described in JP 62-033692 A, phosphoric acid-treated starch as described in JP 62-097892 A, diamines as described in JP 63-056498 A, inorganic amino acid or organic amino acid as described in JP 63-130391 A, organic phosphonic acid containing carboxy group or hydroxy group as described in JP 63-145092 A, compounds containing amino group and phosphonic group as described in JP 63-165183 A, specified carboxylic acid derivatives as described in JP 2-316290 A, phosphoric ester as described in JP 3-215095 A, compounds having one amino group and one oxoacid group of phosphor as described in JP 3-261592 A, aliphatic or aromatic sulfonic acid such as phenylsulfonic acid as described in JP 5-246171 A, compounds containing S atom such like thiosalicylic acid as described in JP 1-301745 A, and compounds having oxoacid group of phosphor or the like as described in JP 4-282637 A.

In addition, coloring by an acid dye as described in JP 60-64352 A can be performed.

It is preferable that treatment for water wettability is performed by a method of dipping an object into an aqueous solution containing alkali metal silicates such as sodium silicate and potassium silicate, a method of forming a hydrophilic undercoat layer by applying a hydrophilic vinylpolmer or a hydrophilic compound or the like.

Treatment for water wettability with an aqueous solution containing alkali metal silicates such as sodium silicate and potassium silicate can be performed in accordance with the methods and steps as described in U.S. Pat. Nos. 2,714,066 and 3,181,461.

Alkali metal silicates include sodium silicate, potassium silicate and lithium silicate. An aqueous solution containing alkali metal silicates may contain an appropriate amount of sodium hydroxide, potassium hydroxide, lithium hydroxide or the like.

In addition, an aqueous solution containing alkali metal silicates may contain alkaline-earth metallic salts or fourth group (IVA group) metallic salts. Examples of alkaline-earth metallic salts are nitrates such as calcium nitrate, strontium nitrate, magnesium nitrate and barium nitrate; sulfates; chlorides; phosphates; acetates; oxalates; and borates. Examples of fourth group (IVA group) metallic salts are titanium tetrachloride, titanium trichloride, potassium titanium fluoride, potassium titanium oxalate, titanium sulfate, titanium tetraiodide, zirconium oxide chloride, zirconium dioxide, zirconium oxychloride, zirconium tetrachloride. These alkali earth metallic salts and fourth group (IVA group) metallic salts can be used in either of a single form or combinations of two kinds or more.

An amount of Si adsorbed by alkali metal silicate treatment can be measured with a flourescent X-ray analyzer, and its adsorbed amount should preferably be 1.0 to 15.0 $mg/m^2$.

An effect to improve insolubility of the surface of a support for a lithographic printing plate with respect to an alkali developer can be obtained by performing this alkali metal silicate treatment. Further, since the elution of an aluminum component into the developer is suppressed, the generation of a development scum attributable to the exhaust of the developer can be reduced.

Since a support for a lithographic printing plate according to the present invention is excellent in contact characteristics between the image recording layer and the support as aforementioned, a sufficient press life can be obtained even when alkali metal silicate treatment is performed. Consequently, even when alkali metal silicate treatment is performed, only the advantages that scum resistance is improved and the generation of a development scum can be reduced can be enjoyed, with no anxiety about deterioration of press life.

In addition, treatment for water wettability by forming a hydrophilic undercoat layer may be performed under the conditions and steps as described in JP 59-101651 A and JP 60-149491 A.

An example of hydrophilic vinylpolymer to be used in this method is a copolymer of vinylpolymerizable compound having sulfo group such as polyvinylsulfonic acid and p-styrenesulfonic acid that has sulfo group, with ordinary vinylpolymerizable compound such as (meta)acrylic alkylester. In addition, an example of a hydrophilic compound to be used in the method is a compound containing at least one selected from a group consisting of —$NH_2$ group, —COOH group, and sulfo group.

<Water Washing Treatment>

It is preferable that water washing is performed after aforementioned each treatment is finished. Pure water, well water, city water or the like can be used for water washing. It is acceptable that a nip device may be used to prevent the treatment solution from being brought into the next process.

<Aluminum Plate (Rolled Aluminum)>

An aluminum plate publicly known can be used to obtain a support for a lithographic printing plate according to the present invention. An aluminum plate used in the present invention is a metal having an aluminum which is stable in dimension as a main component, and is composed of aluminum or aluminum alloy. Besides a pure aluminum plate, an alloy plate containing aluminum as main component and a trace of different elements can be used.

In the present invention, various substrates composed of the aforementioned aluminum or aluminum alloys, and referred to collectively as an aluminum plate. Different elements that may be contained in the aluminum alloy are silicon, iron, manganese, copper, magnesium, chromium, zinc, bismuth, nickel, titanium or the like, and the contents of the different elements in the alloy is 10 wt % or less.

Like this, the composition of an aluminum plate used in the present invention is not specified. For example, the materials conventionally known as described in Aluminum Handbook 4th edition (published by Japan Light Metal Association in 1990) that are, for example, an Al—Mn system aluminum plate of JIS A1050, JIS A1100, JIS A1070, JIS A3004 containing Mn, the internationally registered alloy 3103A and the like can be appropriately utilized. In addition, an Al—Mg system alloy and Al—Mn—Mg system alloy (JIS A3005) into which 0.1 wt % or more of Mg is added can be used to increase tensile strength. Moreover, Al—Zr system or Al—Si system alloy containing Zr or Si can be used. Further, Al—Mg—Si system alloy can also be used.

With regard to JIS1050 materials, the arts that have been proposed by the inventors of the present invention are described in JP 59-153861 A, JP 61-51395 A, JP 62-146694 A, JP 60-215725 A, JP 60-215726 A, JP 60-215727 A, JP 60-216728 A, JP 61-272367 A, JP 58-11759 A, JP 58-42493 A, JP 58-221254 A, JP 62-148295 A, JP 4-254545 A, JP 4-165041 A, JP 3-68939 B, JP 3-234594 A, JP 1-47545 B and JP 62-140894 A. Also known are the arts which have been described in JP 1-35910 B and JP 55-28874 B.

With regard to JIS1070 materials, the arts which have been proposed by the inventors of the present invention are described in JP 7-81264 A, JP 7-305133 A, JP 8-49034 A, JP 8-73974 A, JP 8-108659 A and JP 8-92679 A.

With regard to Al—Mg system alloys, the arts which have been proposed by the inventors of the present invention are described in JP 62-5080 B, JP 63-60823 B, JP 3-61753 B, JP 60-203496 A, JP 60-203497 A, JP 3-11635 B, JP 61-274993 A, JP 62-23794 A, JP 63-47347 A, JP 63-47348 A, JP 63-47349 A, JP 64-1293 A, JP 63-135294 A, JP 63-87288 A, JP 4-73392 B, JP 7-100844 B, JP 62-149856 A, JP 4-73394 B, JP 62-181191 A, JP 5-76530 B, JP 63-30294 A and JP 6-37116 B. The arts are also described in JP 2-215599 A and JP 61-201747 A.

With regard to Al—Mn system alloys, the arts which have been proposed by the inventors of the present invention are described in JP 60-230951 A, JP 1-306288 A and JP 2-293189 A. In addition, others are also described in JP 54-42284 B, JP 4-19290 B, JP 4-19291 B, JP 4-19292 B, JP 61-35995 A, JP 64-51992 A, JP 4-226394 A, U.S. Pat. Nos. 5,009,722, 5,028,276 or the like.

With regard to Al—Mn—Mg system alloys, the arts which have been proposed by the inventors of the present invention are described in JP 62-86143 A and JP 3-222796 A. In addition, others are also described in JP 63-60824 B, JP 60-63346 A, JP 60-63347 A, JP 1-293350 A, EP 223,737, U.S. Pat. No. 4,818,300,. GB 1,222,777 or the like.

With regard to Al—Zr system alloys, the arts which have been proposed by the inventors of the present invention are described in JP 63-15978 B and JP 61-51395 A. In addition, others are also described in JP 63-143234 A, JP 63-143235 A, or the like.

With regard to Al—Mg—Si system alloys, the arts are described in GB 1,421,710.

The following method can be, for example, employed to prepare a plate from an aluminum alloy. First, purification treatment is performed on a molten aluminum alloy adjusted to a predetermined alloy component content and is cast according to a normal method. For the purification treatment, in order to remove unnecessary gases such as hydrogen from the molten metal, such treatment is performed as flux treatment; degassing treatment with argon gas, chlorine gas or the like; filtering treatment using a so-called rigid media filter such as ceramics tube filter, ceramics form filter or the like, a filter using alumina flake, alumina ball and the like as filtering media, or a glass cloth filter, or the like; or a combination of degassing treatment with filtering treatment.

It is preferable that purification treatment as aforementioned be performed to prevent defects caused by foreign matter such as non-metal inclusion in the molten metal and oxides, and defects caused by gasses dissolved in the molten metal. Filtering of a molten metal is described in JP 6-57432 A, JP 3-162530 A, JP 5-140659 A, JP 4-231425 A, JP 4-276031 A, JP 5-311261 A, JP 6-136466 A or the like. In addition, degassing of a molten metal is described in JP 5-51659 A, JP 5-49148 A or the like. The inventors of the present invention have also proposed an art regarding degassing of a molten metal in JP 7-40017 A.

Next, the molten metal to which purification treatment is performed as aforementioned is cast. Casting uses either a method by using a solid mold represented by DC casting method and a method by using a drive mold represented by continuous casting method.

In DC casting, a molten metal is solidified at a cooling rate within a range of 0.5 to 30° C./sec. If the cooling rate is less than 0.5° C./sec, many large intermetallic compounds may be formed. When DC casting is performed, an ingot plate 300 to 800 mm in thickness can be produced. Chipping is performed on this ingot according to a usual method as required, and normally, it is cut by 1 to 30 mm of the surface layer, and by 1 to 10 mm preferably. Before and after the chipping, soaking treatment is performed as required. If heat soaking treatment is performed, heat treatment is performed at 450 to 620° C. for 1 to 48 hours so as not to allow intermetallic compounds to become larger. If treatment time is shorter than 1 hour, an effect of soaking treatment may be insufficient.

Thereafter, hot rolling and cold rolling are performed to produce the rolled plate of an aluminum plate. It is appropriate that the starting temperature of hot rolling is 350 to 500° C. Before and after or halfway of hot rolling, intermediate annealing may be performed. The conditions of intermediate annealing are either a heating with a batch type annealer at 280 to 600° C. for 2 to 20 hours, more preferably at 350 to 500° C. for 2 to 10 hours, or a heating with continuous type annealer at 400 to 600° C. for 6 minutes or less, and more preferably at 450 to 550° C. for 2 minutes or less. Crystal structure can be fined by heating an aluminum plate with a continuous type annealer at a temperature rising speed of 10 to 200° C./sec.

With regard to an aluminum plate finished to a plate of a predetermined thickness, for example, 0.1 to 0.5 mm by the aforementioned processes, in addition, the flatness thereof may be improved with correcting device such as a roller leveler and a tension leveler. Although improvement of the flatness may be performed after the aluminum plate is cut into a sheet form, it is preferable that the improvement is performed in a continuous coil form to enhance its productivity. In addition, an aluminum plate is allowed to pass through a slitter line in order to process the aluminum plate to have a predetermined plate width further, an oil film may be provided on the surface of the aluminum plate to prevent generation of scratches due to friction between the aluminum plates. An oil film which is volatile or non-volatile is appropriately used as required.

On the other hand, methods to be industrially used as continuous casting method include two-roll method (Hunter method), method with cold rolling represented by 3C method, two-belt method (Hazellet method), a method using a cooling belt and a cooling block represented by Alysuisse caster II model. If continuous casting method is used, solidification develops at a cooling rate in a range of 100 to 1,000° C./sec. Continuous casting method is characterized by that the solid solubility percentage of an alloy component with respect to an aluminum matrix can be increased since it generally has a faster cooling speed than that of DC casting method. With regard to continuous casting method, the arts which have been proposed by the inventors of the present invention are described in JP 3-79798 A, JP 5-201166 A, JP 5-156414 A, JP 6-262203 A, JP 6-122949 A, JP 6-210406 A, JP 6-26308 A and the like.

If continuous casting method is performed, for example, with a method using a chill roll such as Hunter method or the like, since a cast plate of thickness 1 to 10 mm can be directly and continuously produced, resulting in a merit that hot rolling process can be omitted. In addition, if a method with a cooling belt such as Hazellet method or the like is used, a cast plate of thickness 10 to 50 mm can be produced. Generally, a continuously cast rolled-plate of thickness 1 to 10 mm can be obtained by disposing a hot roll just after casting to continuously roll a plate.

These continuously cast rolled plates are subjected to treatments such as cold rolling, intermediate annealing, improvement of flatness, treatment of slit and the like, and are finally finished into a predetermined thickness, for example, 0.1 to 0.5 mm. With regard to intermediate annealing and cold rolling conditions in case where continuous casting method is used, the arts which have been proposed by the inventors of the present invention are described in JP 6-220593 A, JP 6-210308 A, JP 7-54111 A, JP 8-92709 A and the like.

An aluminum plate thus manufactured is expected to have various characteristics as mentioned below.

It is preferable, regarding strength of an aluminum plate, 0.2% proof stress is 140 MPa or more to obtain an elasticity required as a support for a lithographic printing plate. In addition, it is preferable that 0.2% proof stress after heating treatment is performed at 270° C. for 3 to 10 minutes is 80 MPa or more, more preferably 100 Mpa or more in order to obtain an elasticity to some extent even if burning treatment is performed. Particularly, if an aluminum plate requires some elasticity, an aluminum material to which Mg or Mn is added can be adopted. Attachment of a plate to the plate cylinder of a printing machine, however, deteriorates if the elasticity is enhanced. For that reason, the material and an amount of the trace components to be added are appropriately selected in accordance with the application. In connection with this, the arts which have been proposed by the inventors of the present invention are described in JP 7-126820 A, JP 62-140894 A and the like.

Since the crystal texture of an aluminum plate surface may cause a defect in surface quality if chemical graining treatment or electrochemical graining treatment is performed on an aluminum plate, it is preferable that the crystal texture graining on the surface is not too coarse. The width of a particle of the crystal texture on the surface of an aluminum plate should preferably be 200 μm or less, more preferably be 100 μm or less, and further preferably be 50 μm or less. In addition, the length of a particle of the crystal texture should preferably be 5,000 μm or less, more preferably be 1,000 μm or less, and further preferably be 500 μm or less. In connection with these, the arts which have been proposed by the inventors of the present invention are described in JP 6-218495 A, JP 7-39906 A, JP 7-124609 A and the like.

Since a defect in surface quality may take place due to the uneven distribution of an alloy component on the surface of an aluminum plate if chemical graining treatment or electrochemical graining treatment is performed, it is preferable that the distribution of the alloy component is not too uneven on the surface. With regard to these, the arts which have been proposed by the inventors of the present invention are described in JP 6-48058 A, JP 5 -301478 A, JP 7-132689 A and the like.

The size or density of intermetallic compounds in an aluminum plate may affect chemical graining treatment or electrochemical graining treatment In connection with this, the arts which have been proposed by the inventors of the present invention are described in JP 7-138687 A, JP 4-254545 A and the like.

According to the present invention, for use, the aluminum plate as described above can be provided with asperities by laminating rolling, transfer or the like in the final rolling process.

An aluminum plate used in the present invention is a continuous belt-like sheet material or plate material. That is, an aluminum web is acceptable and a sheet material cut into a size or the like corresponding to a presensitized plate to be shipped as a product is also acceptable.

Since a scratch on the surface of an aluminum plate may become a defect when processed into a support for a lithographic printing plate, it is necessary to suppress as much as possible the generation of a scratch at a stage before a surface treatment process to produce a support for a lithographic printing plate is performed For that reason, it is preferable that an aluminum plate is packed in a stable form and style so as to avoid being scratched.

In case of aluminum web, as a style of packing aluminum, for example, a hard board and a felt sheet are laid over a pallet made of iron, toroidal cardboards are put at both ends of a product, the entire product is wrapped with a polymer tube, a wooden toroid is inserted into the inner diameter section of a coil, the periphery of a coil is covered with a felt sheet, the product is fastened with a hoop iron and the indication is attached to its periphery. In addition, a polyethylene film can be used for packing material, and a needle felt and a hard board can be used for buffer. There are various packing forms besides this one. As long as it provides stable and scratch-free transportation or the like, packing is not limited to this method mentioned above.

The thickness of an aluminum plate used in the present invention is about 0.1 to 0.6 mm, preferably be 0.15 to 0.4 mm, and more preferably be 0.2 to 0.3 mm. This thickness can be appropriately changed according to the size of a printing machine, the size of a printing plate, the request of a user, or the like.

[Presensitized Plate]

A presensitized plate according to the present invention can be prepared by providing an image recording layer such as a photosensitive layer, thermosensitive layer or the like as illustrated below on the support for a lithographic printing plate. An image recording layer is not particularly limited, and preferred examples include conventional positive type, conventional negative type, photopolymer type, thermal positive type, thermal negative type and development-dispensable type that can be developed on a printer. Moreover, in the case of a support for a lithographic printing plate of the third aspect according to the present invention, a type using heat to form an image is preferable, for example, preferably taken up are thermal positive type, thermal negative type and development-dispensable type.

Detailedly described below are these preferred image recording layers.

<Conventional Positive Type>

As a photosensitive resin composition used suitably for the photosensitive layer of the conventional positive type, for example, a composition containing an o-quinonediazide compound and a high-molecular compound that is water-insoluble and alkali-soluble (hereinafter, referred to as an "alkali-soluble high-molecular compound") is cited.

Cited as such an o-quinonediazide compound are, for example, the ester of 1,2-naphthoquinone-2-diazide-5-sulfonyl chloride and phenol-formaldehyde resin or cresol-formaldehyde resin, and the ester of 1,2-naphthoquinone-2-diazide-5-sulfonyl chloride and pyrogallol-acetone resin, which is described in U.S. Pat. No. 3,635,709.

Cited as such an alkali-soluble high-molecular compound are, for example, phenol-formaldehyde resin, cresol-formaldehyde resin, phenol-cresol-formaldehyde co-condensed resin, polyhydroxystyrene, copolymer of N-(4-hydroxyphenyl)methacrylamide, carboxy group-containing polymer described in JP 7-36184 A, acrylic resin containing a phenolic hydroxy group as described in JP 51-34711 A, acrylic resin containing a sulfonamide group described in JP 2-866 A, and urethane resin.

Furthermore, it is preferable that a compound such as a sensitivity regulator, a printing agent and a dye, which are described in [0024] to [0027] of JP 7-92660 A, or a surfactant for improving a coating property of the photosensitive resin composition, which is as described in [0031] of JP 7-92660 A, is added to the photosensitive resin composition.

<Conventional Negative Type>

As a photosensitive resin composition used suitably for the photosensitive layer of the conventional negative type, a composition containing diazo resin and a high-molecular compound that is alkali-soluble or alkali-swellable (hereinafter, referred to as a "binding agent") is cited.

Cited as such diazo resin is, for example, a condensate of an aromatic diazonium salt and a compound containing an active carbonyl group such as formaldehyde, and an inorganic salt of organic solvent-soluble diazo resin, which is a reaction product of a condensate of p-diazo phenyl amines group and formaldehyde with hexafluorophosphate or tetrafluoroborate. Particularly, a high-molecular-weight diazo compound containing 20 mol % or more of a hexamer or larger, which is described in JP 59-78340 A, is preferable.

For example, copolymer containing, as an essential component, acrylic acid, methacrylic acid, crotonic acid or maleic acid is cited as a suitable binding agent. Specifically, multi-copolymer of monomer such as 2-hydroxyethyl(meth) acrylate, (meth)acrylonitrile and (meth)acrylic acid, which is as described in JP 50-118802 A, and multi-copolymer composed of alkylacrylate, (metha)acrylonitrile and unsaturated carboxylic acid, which is as described in JP 56-4144 A, are cited.

Furthermore, to the photosensitive resin composition, it is preferable to add a compound such as a printing agent, a dye, a plasticizer for imparting the flexibility of the coating layer, abrasion resistance, a development accelerator, and a surfactant for improving the coating property, which are described in [0014] and [0015] of JP 7-281425 A.

It is preferable that an intermediate layer containing a high-molecular compound having a constituent with an acid group and a constituent with an onium group, which is described in JP 2000-105462 A, is provided as an undercoat layer of the above-described positive or negative photosensitive layer of the conventional type.

<Photopolymer Type>

A photosensitive composition of a photopolymerization type (hereinafter, referred to as a "photopolymerizable composition"), which is used suitably for the photosensitive layer of the photopolymer type, contains a compound containing ethylenic unsaturated bonding capable of addition polymerization (hereinafter, simply referred to as a "compound containing ethylenic unsaturated bonding"), a photopolymerization initiator and a high-molecular binding agent as essential components. According to needs, the photopolymerizable composition contains various compounds such as a colorant, a plasticizer and a thermal polymerization inhibitor.

A compound containing ethylenic unsaturated bonding, which is contained in the photopolymerizable composition, is a compound having the ethylenic unsaturated bonding as carrying out addition polymerization, crosslinking and curing by the action of the photopolymerization initiator when the photopolymerizable composition is irradiated by active light ray. The compound containing the ethylenic unsaturated bonding can be arbitrarily selected from compounds, each having at least one, and preferably two or more of end ethylenic unsaturated bondings. For example, this compound has a chemical form of monomer, prepolymer (that is, dimmer, trimer or oligomer), a mixture thereof, a copolymer thereof or the like. Cited as examples of the monomer are the ester of unsaturated carboxylic acid (for example, acrylic acid, methacrylic acid, itaconic acid, crotonic acid, isocrotonic acid and maleic acid) and an aliphatic polyhydric alcohol compound and the amide of unsaturated carboxylic acid and an aliphatic polyamine compound. Moreover, a urethane addition polymerizable compound is also suitable.

As the photopolymerization initiator contained in the photopolymerizable composition, a variety of photopolymerization initiators or combined systems of two or more photopolymerization initiators (photo initiation systems) can be appropriately selected for use according to a wavelength of a light source to be used. For example, initiation systems described in [0021] to [0023] of JP 2001-22079 A are preferable.

Since the high-molecular binding agent contained in the photopolymerizable composition needs not only to function as a coating layer forming agent for the photopolymerizable composition but also to dissolve the photosensitive layer in an alkali developer, an organic high-molecular polymer that is soluble or swellable in an aqueous solution of alkali is used. As the above-described high-molecular binding agent, the agent described in [0036] to [00631 of JP 2001-22079 A.

It is preferable to add the additive described in [0079] to (0088] of JP 2001-22079 A (for example, a surfactant for improving the coating property) to the photopolymerizable composition.

Moreover, it is also preferable to provide an oxygen-shieldable protective layer on the above-described photosensitive layer for preventing the polymerization inhibiting action of oxygen. Poly(vinyl alcohol) and a copolymer thereof are cited as a polymer contained in the oxygen-shieldable protective layer.

Furthermore, it is also preferable that, as a lower layer of the above-described photosensitive layer, an adhesive layer as described in [0131] to [0165] of JP 2001-228608 A is provided.

<Thermal Positive Type>

The thermosensitive layer of the thermal positive type contains alkali-soluble high-molecular compound and a photothermal conversion agent.

The alkali-soluble high-molecular compound includes a homopolymer containing an acid group in the polymer, a copolymer thereof and a mixture thereof. Particularly, the one having an acid group such as a (1) phenolic hydroxy group (—Ar—OH) and a (2) sulfonamide group (—$SO_2$NH—R) is preferable in terms of solubility to the alkali developer. Above all, the one having the phenolic hydroxy group is preferable since it is excellent in image-forming capability in the exposure by an infrared ray laser or the like. For example, novolac resin such as phenol-formaldehyde resin, m-cresol-formaldehyde resin, p-cresol-formaldehyde resin, m-/p-mixed cresol-formaldehyde resin and phenol/cresol (any of m-, p- and m-/p-mixed may be allowed)-mixed-formaldehyde resin, and pyrogallol-acetone resin are preferably cited. More specifically, the polymers described in [0023] to [0042] of JP 2001-305722 A are preferably used.

The photothermal conversion agent converts exposure energy into heat to enable efficient release execution of an interaction in an exposed region of the thermosensitive layer. From a viewpoint of a recording sensitivity, pigment or dye, which has a light absorbing band in the infrared band ranging from 700 to 1200 nm in wavelength, is preferable. Concretely cited as the dye are azo dye, azo dye in the form of metallic complex salt, pyrazolone azo dye, naphthoquinone dye, anthraquinone dye, phthalocyanine dye, carbonium dye, quinonimine dye, methine dye, cyanine dye, squarylium dyestuff, pyrylium salt, metal thiolate complex (for example, nickel thiolate complex) and the like. Particularly, the cyanine dye is preferable and, for example, the cyanine dye represented by the general formula (I) in JP 2001-305722 A is cited.

To the composition for use in the thermosensitive layer of the thermal positive type, it is preferable to add a compound such as a sensitivity regulator, a printing agent and a dye, and the surfactant for improving the coating capability, which are similar to those described in the paragraph of the foregoing conventional positive type. Specifically, the compounds described in [0053] to [0059] of JP 2001-305722 A are preferable.

The thermosensitive layer of the thermal positive type may be a single layer or may have a two-layer structure as described in JP 11-218914 A.

It is preferable to provide an undercoat layer between the thermosensitive layer of the thermal positive type and a support thereof. As a component contained in the undercoat layer, the variety of organic compounds described in [0068] of JP 2001-305722 A are cited.

<Thermal Negative Type>

The thermosensitive layer of the thermal negative type is a negative thermosensitive layer in which an infrared laser-irradiated areas are cured to form image areas.

As one of such thermosensitive layers of the thermal negative type, a polymerizable-type layer (polymerizable layer) is suitably cited. The polymerizable layer contains an (A) infrared absorbent, a (B) radical generator (radical polymerization initiator), a (C) radical polymerizable compound causing a polymerization reaction by the generated radicals and curing, and a (D) binder polymer.

In the polymerizable layer, the infrared ray absorbed by the infrared absorbent is converted into heat, then the radical polymerization initiator such as onium salt is decomposed by the heat generated, and thus radicals are generated. The radical polymerizable compound is selected from compounds having end ethylenic unsaturated bondings, and a chain polymerization reaction occurs by the generated radicals, and thus the radical polymerizable compound cures.

As the (A) infrared absorbent, for example, the photothermal conversion agent contained in the above-described thermosensitive layer of the thermal positive type is cited. Particularly, the ones described in [0017] to [0019] of JP 2001-133969 A are cited as concrete examples of the cyanine dyestuff. The onium salt is cited as the (B) radical generator. The ones described in [0030] to [0033] of JP 2001-133969 A are cited as concrete examples of the onium salt used suitably. The (C) radical polymerizable compound is selected from compounds, each having at least one, and preferably two or more of the end ethylenic unsaturated bondings. It is preferable to use linear organic polymer as the (D) binder polymer, and linear organic polymer that is soluble or swellable in water or alkalescent water is selected. Among such polymers, particularly, (meth)acrylic resin having a benzyl group or an allyl group and a carboxy group in side chains is excellent in a balance of layer strength, sensitivity and development property, and is suitable. For the (C) radical polymerizable compound and the (D) binder polymer, the ones described in detail in [0036] to [0060] of JP 2001-133969 A can be used. It is also preferable to add the additives described in [0061] to [0068] of JP 2001-133969 A (for example, the surfactant for improving the coating property) as other additives.

Besides the polymerizable-type layer, an acid cross-linkable-type layer (acid cross-linkable layer) is suitably cited as one of the thermosensitive layers of the thermal negative type. The acid cross-linkable layer contains a (E) compound generating acid by light or heat (hereinafter, referred to as an "acid generator"), a (F) compound cross-linking by the generated acid (hereinafter, referred to as a "cross-linking"), and a (G) alkali-soluble high-molecular compound capable which can react with the cross-linking agent under the presence of the acid. The (A) infrared absorbent may be mixed in the acid cross-linkable in order to absorb the energy of the infrared laser efficiently. Cited as the (E) acid generator is a compound capable of generating acid by thermal decomposition, such as a photoinitiator for the photopolymerization, a color-turning agent (i.e., dye stuff) and an acid generator for use in microresist or the like. Cited as the (F) cross-linking agent are an (i) aromatic compound substituted with a hydroxymethyl group or an alkoxymethyl group, a (ii) compound having a N-hydroxymethyl group, a N-alkoxymethyl group or a N-acyloxymethyl group, and an (iii) epoxy compound. As the (G) alkali-soluble high-molecular compound, novolac resin, polymer having a hydroxyaryl group in the side chain, and the like are cited.

<Development-dispensable Type>

There are various types including a thermoplastic particle polymer type, a microcapsule type, a type containing sulfonic acid-generating polymer and the like in the thermosensitive layer of the development-dispensable type. The present invention is particularly preferable for the development-dispensable type which can be developed on a printing machine.

In the thermoplastic particle polymer type, (H) hydrophobic thermowelding resin particles are dispersed in a (J) hydrophilic polymer matrix, and can be welded by heat of exposed areas and fused mutually, thus forming hydrophobic areas, that is, image areas formed by polymers.

The (H) hydrophobic thermowelding resin particles (hereinafter, referred to as "particulate polymers"), which mutually fuse and coalesce by the heat, are preferable. The particulate polymers, which have hydrophilic surfaces and can be dispersed in a hydrophilic component such as a fountain solution, are preferable. Suitably cited as the particulate polymers are thermoplastic particulate polymers described in Research Disclosure No. 33303 (Published in January, 1992), JP 9-123387 A, JP 9-131850 A, JP 9-171249 A, JP 9-171250 A, EP 931,647 A and the like Cited as concrete examples are homopolymers of monomers of ethylene, styrene, vinyl chloride, methyl acrylate, ethyl acrylate, methyl methacrylate, ethyl methacrylate, vinylidene chloride, acrylonitrile, vinyl carbazole or the like; copolymers thereof; or mixtures thereof. Among them, it is preferable to use polystyrene and poly(methyl methacrylate). The particulate polymers having the hydrophilic surfaces include: polymers which are hydrophilic themselves such as polymers constituting the particles, which are hydrophilic themselves, and polymers to which hydrophilicity is imparted by introducing hydrophilic groups into main chains or side chains of the polymers; and polymers of which surfaces are made hydrophilic by adsorbing hydrophilic polymer such as poly(vinyl alcohol) and poly(ethylene glycol), hydrophilic oligomer or a hydrophilic low-molecular weight compound to the surfaces of the particulate polymers. As the particulate polymers, particulate polymers having thermoreactive functional groups are more preferable. The particulate polymers as described above are dispersed in the (J) hydrophilic high-molecular matrix, and thus obtaining good on-machine development property in the case of carrying out development on a machine, and further, the coating layer strength of the thermosensitive layer is also improved.

As the microcapsule type, a type described in JP 2000-118160 A and a microcapsule type containing a compound having a thermoreactive functional group as described in JP 2001-277740 A are preferably cited.

As the sulfonic acid-generating polymer for use in the type containing the sulfonic acid-generating polymer, for example, polymer having a sulfonic acid ester group, a disulfonic group or a sec- or tert-sulfonamide group in the side chain described in JP 10-282672 A is cited.

The hydrophilic resin can be contained in the thermosensitive layer of the development-dispensable type, and thus, not only the on-machine development property would be improved, but also the coating layer strength of the thermosensitive layer itself would be improved. Moreover, the hydrophilic resin is cross-linked and cured, thus making it possible to obtain a presensitized plate eliminating a necessity of development process. Preferable as the hydrophilic resin, for example, the one having a hydrophilic group such as a hydroxy group, a carboxy group, a hydroxyethyl group, a hydroxypropyl group, an amino group, an aminoethyl group, an aminopropyl group and a carboxymethyl group, and sol-gel conversion type bonding resin that is hydrophilic are preferable.

As concrete examples of the hydrophilic resin, the ones enumerated as the hydrophilic resins for use as the above-described (J) hydrophilic high-molecular matrix are cited.

Among them, the sol-gel conversion type bonding resin is preferable.

It is necessary to add the photothermal conversion agent to the thermosensitive layer of the development-dispensable type. It is satisfactory that the photothermal conversion agent may be a substance absorbing light with a wavelength of 700 nm or more, and a dye similar to the dye for use in the above-described thermal positive type is particularly preferable.

<Backcoat Layer>

On the reverse side of the presensitized plate of the present invention, which is obtained by providing various types of image recording layers on the support for the lithographic printing plate of the present invention, a back-coat layer composed of an organic high-molecular compound can be provided according to needs in order to prevent the image recording layers from being scratched in the case of stacking the presensitized plate or the like.

<Method of Producing a Presensitized Plate>

Usually, the respective layers of the image recording layer and the like can be produced by coating a coating liquid obtained by dissolving the foregoing components into a solvent on the support for the lithographic printing plate.

Cited as solvents used herein are ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N, N-dimethylacetamide, N, N-dimethylformamide, tetramethylurea, N-methylpyrrolidone, dimethyl sulfoxide, sulfolan, γ-butyrolactone, toluene, water and the like. However, the present invention is not limited to this. These solvents are used singly or mixedly.

It is preferable that the concentration of the foregoing components (entire solid part) in the solvent range from 1 to 50 wt %.

Various coating methods can be used. For example, bar coater coating, rotation coating, spray coating, curtain coating, dip coating, air knife coating, blade coating, roll coating and the like can be cited.

[Method of Producing a Lithographic Printing Plate]

The presensitized plate of the present invention is made into a lithographic printing plate by various treatment methods in accordance with the kind of the image recording layer.

In general, image exposure is carried out. Cited as light sources of active rays for use in the image exposure are, for example, a mercury lamp, a metal halide lamp, a xenon lamp and a chemical lamp. As laser beams, for example, helium-neon (He—Ne) laser, argon laser, krypton laser, helium-cadmium laser, KrF excimer laser, semiconductor laser, YAG laser and YAG-SHG laser are cited.

When the image recording layer is of any of the thermal types, the conventional types and the photopolymer type, it is preferable that the presensitized plate is developed by use of a developer after the exposure to obtain the lithographic printing plate. Although a preferable developer for use in the presensitized plate of the present invention is not particularly limited as long as the developer is an alkali developer, an alkali aqueous solution that does not substantially contain an organic solvent is preferable. Moreover, the development can be carried out by use of a developer that does not substantially contain alkali metal silicate. The developing method using the developer that does not substantially contain the alkali metal silicate is described in detail in JP 11-109637 A, and the contents described in JP 11-109637 A can be used. Moreover, the presensitized plate of the present invention can be developed by use of a developer that contains the alkali metal silicate.

Above all, one of preferred aspects includes a method of producing a lithographic printing plate (processing method) according to the present invention where a lithographic printing plate is obtained by performing a development with a developer containing substantially no alkali metal silicates after a presensitized plate of the present invention is exposed if an image recording layer is either of thermal positive type, conventional positive type or photopolymer type. Described below is a method of producing a lithographic printing plate according to the present invention.

A method of producing a lithographic printing plate according to the present invention is characterized by developing a presensitized plate according to the present invention with a developer containing substantially no alkali metal silicates.

If a presensitized plate according to the present invention is developed with a developer containing substantially no alkali metal silicates after exposed although alkali metal silicate treatment is not performed on a support for a lithographic printing plate, a lithographic printing plate excellent in scum resistance after being left can be obtained. Moreover, it is acceptable that alkali metal silicate treatment is performed on the support for a lithographic printing plate.

In addition, there are no problems that non-image areas is whitened and scum or sludge generates at the time of development since a developer used contains substantially no alkali metal silicates with a method of producing a lithographic printing plate according to the present invention.

Moreover, a method of performing a development with a developer containing substantially no alkali metal silicates is described in detail in JP 11-109637 A and the contents described in JP 11-109637 A can be used in the present invention.

Although a preferred developer used in a method of producing a lithographic printing plate according to the present invention is not particularly limited as long as the developer contains substantially no alkali metal silicates, it is preferable that it is an alkali aqueous solution containing substantially no organic solvent. However, it may contain an organic solvent as required.

In addition, it is preferable that this developer contains saccharaides. For example, cited is a developer that has at least one compound selected from non-reducing sugar and at least one kind of base, as principal components and that is at 9.0 to 13.5 pH.

Furthermore, a developer can contain various surfactants to promote development property, diffuse development scum and improve ink receptivity in the image areas of a lithographic printing plate as required. In the present invention, either of anionic surfactant, cationic surfactant, nonionic surfactant or amphoteric surfactant can be used. In addition, a developer can contain various development stabilizers. Moreover, a developer can also contain a reducing agent to prevent a lithographic printing plate from being scummed. Especially, it is effective to develop a presensitized plate having a negative type photosensitive layer containing a photosensitive diazonium chloride compound. In addition, a developer can contain an organic carboxylic acid.

The contents of literatures cited herein are incorporated herein by reference in its entirety.

EXAMPLE

Although the present invention will be described in detail with reference to examples, the present invention is not limited to these examples.

<Example of the First Aspect According to the Present Invention>

1-1. Preparation of Support for a Lithographic Printing Plates

Example 1-1

<Aluminum Plate>

Molten metal was prepared by using an aluminum alloy containing Si: 0.06 wt %, Fe: 0.30 wt %, Cu: 0.005 wt %, Mn: 0.001 wt %, Mg: 0.001 wt %, Zn: 0.001 wt % and Ti: 0.03 wt %, and containing Al and inevitable impurities for the remaining portion. After molten metal treatment and filtering were performed, an ingot having a thickness of 500 mm and a width of 1200 mm was made by a DC casting method. After the surface was chopped to have an average thickness of 10 mm with a surface chipper, the ingot was held at 550° C. for about 5 hours for soaking. When the temperature dropped to 400° C., the ingot was formed into a rolled plate having a thickness of 2.7 mm by using a hot rolling mill. Further, after the heat treatment was performed at 500° C. with a continuous annealing machine, the roller plate was finished into an aluminum plate having a thickness of 0.24 mm with cold rolling to obtain an aluminum plate of JIS 1050 material. This aluminum plate was processed to have a width of 1030 mm, and surface treatment described below was continuously carried out.

<Surface Treatment>

Various surface treatments of (b) to (j) mentioned below were continuously performed. Furthermore, a liquid squeezing was performed by a nip roller after each treatment and water washing.

(b) Alkali Etching Treatment

Etching treatment was performed on the aluminum plate obtained in the foregoing manner by spraying an aqueous solution containing 2.6 wt % of sodium hydroxide and 6.5 wt % of aluminum ion at a temperature of 70° C. and the aluminum plate was dissolved by 6 g/m$^2$. After that, washing was performed by spraying water.

(c) Desmutting Treatment

The aluminum plate was subjected to spray desmutting treatment in aqueous solution of nitric acid 1 wt % (containing 0.5 wt % of aluminum ions) at 30° C., and then washed by spraying water. For the aqueous solution of nitric acid used in the desmutting treatment, waste solution generated in a process of electrochemical graining treatment carried out by using an alternating current in an aqueous solution of nitric acid to be described later was utilized.

(d) Electrochemical Graining Treatment

Electrochemical graining treatment was continuously performed by using an alternating current voltage of 60 Hz. Electrolyte in this case was aqueous solution of nitric acid 10.5 g/L (containing 5 g/L of aluminum ion and 0.007 wt % of ammonium ion) at a temperature of 50° C. An alternating current supply waveform was like that shown in FIG. 2. With the time TP necessary for a current value to reach its peak from zero set as 0.8 msec, and duty ratio set at 1:1, and by using a trapezoidal wave, the electrochemical graining treatment was performed while a carbon electrode was set as a counter electrode. A ferrite was used for an auxiliary anode. An electrolytic cell used is shown in FIG. 3.

The current density was 30 A/dm$^2$ at a current peak value. The total of the quantity of electricity was 220 C/dm$^2$ when the aluminum plate was at the anode side. An amount equivalent to 5% of a current flowing from the power supply was shunted to an auxiliary anode.

The aluminum plate was then washed by spraying water.

(e) Alkali Etching Treatment

Etching treatment was performed on an aluminum plate by straying an aqueous solution containing 26 wt % of sodium hydroxide and 6.5 wt % of aluminum ion at 32° C. The aluminum plate was dissolved by 0.25 g/m$^2$, a smut component mainly containing aluminum hydroxide generated in the previous stage of the electrochemical graining treatment performed by using alternating current was removed, and edge portions of formed pits were dissolved to be made smooth. Then, the aluminum plate was washed by spraying water.

(f) Desmutting Treatment

The aluminum plate was subjected to spray desmutting treatment in aqueous solution of nitric acid 15 wt % (containing 4.5 wt % of aluminum ions) at 30° C., and then washed by spraying water. For the aqueous solution of nitric acid used in the desmutting treatment, waste solution generated in the process of the electrochemical graining treatment carried out by using an alternating current of a nitric acid was utilized.

(g) Electrochemical Graining Treatment

Electrochemical graining treatment was continuously performed by using an alternating current voltage of 60 Hz. Electrolyte in this case was aqueous solution of hydrochloric acid 7.5 g/L (containing 5 g/L of aluminum ion) at a temperature of 35° C. An alternating current supply waveform was like that shown in FIG. 2. With the time TP necessary for a current value to reach its peak from zero set as 0.8 msec, and duty ratio set at 1:1, and by using a trapezoidal wave, the electrochemical graining treatment was performed while a carbon electrode was set as a counter electrode. A ferrite was used for an auxiliary anode. An electrolytic cell used is shown in FIG. 3.

The current density was 25 A/dm$^2$ at a current peak value. The total of the quantity of electricity was 50 C/dm$^2$ when the aluminum plate was at the anode side Then, the aluminum plate was washed by spraying water.

(h) Alkali Etching Treatment

Etching treatment was performed on an aluminum plate by straying an aqueous solution containing 26 wt % of sodium hydroxide and 6.5 wt % of aluminum ion at 32° C. The aluminum plate was dissolved by 0.1 g/m$^2$, a smut component mainly containing aluminum hydroxide generated in the previous stage of the electrochemical graining treatment performed by using alternating current was removed, and edge portions of formed pits were dissolved to be made smooth. Then, the aluminum plate was washed by spraying water.

(i) Desmutting Treatment

The aluminum plate was subjected to spray desmutting treatment in aqueous solution of sulfuric acid 25 wt % (containing 0.5 wt % of aluminum ions) at 60° C., and then washed by spraying water.

(j) Anodizing Treatment

By using anodizing device with a structure shown in FIG. 4, anodizing treatment was carried out. Accordingly, a support for a lithographic printing plate according to Example 1-1 was obtained. Electrolyte supplied for each of first and second electrolytic portions was sulfuric acid. For each electrolyte, the concentration of sulfuric acid was 170 g/L (containing 0.5 wt % of aluminum ion) at a temperature of 38° C. Then, washing by spraying water was carried out. The final amount of an anodized layer was 2.7 $g/m^2$.

Examples 1-2 and 1-3

Supports for a lithographic printing plate according to Examples 1-2 and 1-3 were obtained with the same method as in Example 1-1, except that the amounts of the aluminum plate dissolved were 0.2 $g/m^2$ and 0.5 $g/m^2$, respectively, in (h) mentioned above.

Example 1-4

A support for a lithographic printing plate according to Example 1-4 was obtained with the same method as in Example 1-1, except that the frequency of an alternating current voltage was set at 30 Hz in (g) mentioned above, and (h) mentioned above was not performed.

Examples 1-5 and 1-6

Supports for a lithographic printing plate according to Examples 1-5 and 1-6 were obtained with the same method as in Example 1-1, except that the frequency of an alternating current voltage were set at 300 Hz and 500 Hz, respectively, in (g) mentioned above.

Example 1-7

A support for a lithographic printing plate according to Example 1-7 was obtained with the same method as in Example 1-1, except that the current density was set 15 $A/dm^2$ at a current peak value in (d) mentioned above.

Example 1-8

A support for a lithographic printing plate according to Example 1-8 was obtained with the same method as in Example 1-1, except that the temperature of an electrolyte was set at 70° C. in (d) mentioned above Examples 1-9 to 1-13

Supports for a lithographic printing plate according to Examples 1-9 to 1-13 were obtained with the same methods as in Examples 1-1, 1-4, 1-5, 1-7 and 1-8, except that (a) to be mentioned below were performed before (b) mentioned above.

(a) Mechanical Graining Treatment

Mechanical graining treatment was carried out by rotating roller nylon brushes while supplying suspension containing abrasive (pumice) and water (specific gravity: 1.12) as abrasive slurry liquid to the surface of the aluminum plate, using device shown in FIG. 1. In FIG. 1, 1 represents an aluminum plate, 2 and 4 represent roller brushes, 3 represents an abrasive slurry liquid, and 5, 6, 7 and 8 represent supporting rollers. The abrasive had average particle size of 40 μm and the maximum particle size of 100 μm. A material for the nylon brush was 6•10 nylon, having a bristle length of 50 mm, and a bristle diameter of 0.3 mm. The Nylon brush was made by boring holes in a φ300 mm stainless cylinder and densely implanting bristles therein. Three of such rotary brushes were prepared. Each distance between two supporting rollers (φ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate. The number of rotations of the brushes was 200 rpm.

Example 1-14

A support for a lithographic printing plate according to Example 1-14 was obtained with the same method as in Example 1-9, except that an abrasive was silica sand in (a) mentioned above.

Example 1-15

A support for a lithographic printing plate according to Example 1-15 was obtained with the same methods as in Example 1-14, except that the number of rotations of the brushes was 100 rpm in (a) mentioned above.

Example 1-16

A support for a lithographic printing plate according to Example 1-16 was obtained with the same method as in Example 1-1, except that (z) to be described below was performed before (b) mentioned above.

(z) Honing Treatment

Asperities were provided by pressurizing water in which iron balls of diameter 100 μm were suspended, thereby jetting the water onto the surface of the aluminum plate.

Example 1-17

A support for a lithographic printing plate according to Example 1-17 was obtained with the same methods as in Example 1-9, except that an internationally registered alloy 3103 material was used in place of JIS 1050 material.

Comparative Example 1-1

A support for a lithographic printing plate according to Comparative Example 1-1 was obtained with the same method as in Example 1-3, except that the frequency of alternating current voltage was set at 10 Hz in (g) mentioned above.

Comparative Example 1-2

A support for a lithographic printing plate according to Comparative Example 1-2 was obtained with the same method as in Example 1-1, except that the frequency of alternating current voltage was set at 10 Hz in (g) mentioned above and the amount of the aluminum plate dissolved was set at 1.0 $g/m^2$ in (h) mentioned above.

Comparative Example 1-3

A support for a lithographic printing plate according to Comparative Example 1-3 was obtained with the same method as in Example 1-1, except that the frequency of alternating current voltage was set at 15 Hz in (d) mentioned above.

Comparative Example 1-4

A support for a lithographic printing plate according to Comparative Example 1-4 was obtained with the same method as in Example 1-1, except that the temperature of an electrolyte was set at 80° C. and TP was set at 0 msec. in (d) mentioned above.

Comparative Example 1-5

A support for a lithographic printing plate according to Comparative Example 1-5 was obtained with the same method as in Example 1-8, except that the frequency of alternating current voltage was set at 10 Hz in (g) mentioned above and the amount of the aluminum plate dissolved was set at 1.0 $g/m^2$ in (h) mentioned above.

Comparative Example 1-6

A support for a lithographic printing plate according to Comparative Example 1-6 was obtained with the same method as in Example 1-9, except that (g), (h) and (i) mentioned above were not performed.

Comparative Example 1-7

A support for a lithographic printing plate according to Comparative Example 1-7 was obtained with the same method as in Example 1-1, except that (g), (h) and (i) mentioned above were not performed.

Comparative Example 1-8

A support for a lithographic printing plate according to Comparative Example 1-8 was obtained with the same method as in Example 1-1, except that (d), (e) and (f) mentioned above were not performed and the total quantity of electricity when the aluminum plate was at the anode side was set at 500 $C/dm^2$.

Comparative Examples 1-9 and 1-10

Supports for a lithographic printing plate according to Comparative Examples 1-9 and 1-10 were obtained with the same method as in Comparative Example 1-8, except that the amounts of the aluminum plates dissolved were set at 0.2 $g/m^2$ and 0.5 $g/m^2$, respectively, in (h) mentioned above.

Comparative Example 1-11

A support for a lithographic printing plate according to Comparative Example 1-11 was obtained with the same method as in Example 1-9, except that (d), (e), (f), (g), (h) and (i) mentioned above were not performed.

Comparative Example 1-12

A support for a lithographic printing plate according to Comparative Example 1-12 was obtained with the same method as in Example 1-1, except that (d), (e) and (f) mentioned above were not performed.

Comparative Example 1-13

A support for a lithographic printing plate according to Comparative Example 1-13 was obtained with the same method as in Example 1-9, except that (d), (e) and (f) mentioned above were not performed.

Comparative Example 1-14

A support for a lithographic printing plate according to Comparative Example 1-14 was obtained with the same method as in Comparative Example 1-9, except that a mixture of hydrochloric acid and acetic acid (hydrochloric acid concentration: 7.5 g/L and acetic acid concentration: 15 g/L) as an electrolyte was used in (g) mentioned above. 1-2. Measurement of surface shape of a support for a lithographic printing plate For concave portions of the surface of each of the supports for a lithographic printing plate obtained as mentioned above, measurement of the (1) to (4) as below were performed.

The results were shown in Table 1. Note that, "-" in the table 1 indicates that there was no concave portion in the corresponding wavelength.

(1) Average Aperture Diameter of a Grained Structure with Medium Undulation

The surface of the support was photographed at a magnification of 2,000 from right above with an SEM. Next, in SEM micrograph obtained, 50 pits of a grained structure with medium undulation (pits of medium undulation) in which circumferences of the pits were annularly connected were extracted, aperture diameters were determined by reading the diameters of the pits, and an average diameter aperture was calculated. (2) Average Aperture Diameter of a Grained Structure with Small Undulation The surface of the support for a lithographic printing plate was photographed at a magnification of 50,000 from right above with an SEM. In an SEM micrograph obtained, 50 pits of the grained structure with small undulation (pits of small undulation) were extracted, the aperture diameter was determined by reading the diameters of the pits and an average aperture diameter was calculated.

(3) Average of Ratio of Depth with Respect to the Aperture Diameter of a Grained Structure with Small Undulation The average of ratio of depth with respect to aperture diameter of a grained structure with small undulation was obtained as follows. A broken-out section of the support was photographed at a magnification of 50,000 with a high resolution SEM. In an SEM micrograph obtained, 20 pits of small undulation with aperture diameter 0.3 μm or less were extracted, the ratios were obtained by reading the aperture diameters and depths, and an average ratio was calculated.

(4) Average Wavelength of a Grained Structure with Large Undulation

A two-dimensional roughness measurement was performed with a stylus type surface roughness gauge (sufcom576 made by Tokyo Seimitsu Co., Ltd.), a mean spacing of peaks $S_m$ specified in ISO4287 was measured five times, and its mean value was determined to be an average wavelength. The two-dimensional roughness measurement was performed under the following conditions.

Cut off: 0.8 μm, gradient correction: FLAT-ML, measured length: 3 mm, depth magnification: 10,000, scanning speed: 0.3 mm/sec., and sensing pin diameter: 2 μm.

1-3. Preparation of Presensitized Plates

Each of presensitized plates was obtained by providing either of the following three kinds of image recording layers in combinations as shown in Table 1 on each support for a lithographic printing plate obtained as mentioned above.

(1) Conventional Positive Type Image Recording Layer

Undercoat solution containing a composition described below was coated on the support for a lithographic printing plate, obtained in the foregoing manner, and dried at a temperature of 80° C. for 30 sec, to form a coating layer of undercoat layer. The coating amount after drying was 10 $mg/m^2$.

<Composition of Undercoat Solution>

| | |
|---|---|
| Dihydroxyethylglycine | 0.05 parts by weight |
| Methanol | 94.95 parts by weight |
| Water | 5.00 parts by weight |

Photosensitive resin solution containing a composition described below was coated on the undercoat layer, and dried at a temperature of 100° C. for 2 min., to form a photosensitive layer (conventional positive type image recording layer) and a presensitized plate was obtained. The coating amount after drying was 2.5 $g/m^2$.

<Composition of Photosensitive Resin Solution>

| | |
|---|---|
| Ester of naphtoquinone-1,2-dyazide-5-sulfonylchloride and pyrogallol-acetone resin | 0.73 g |
| Cresol-novolac resin | 2.00 g |
| Dye (Oil Blue #603 made by Orient Chemical Industries, Ltd.) | 0.04 g |
| Ethylene dichloride | 16 g |
| 2-methoxyethylacetate | 12 g |

(2) Thermal Positive Type Image Recording Layer

Alkali metal silicate treatment (silicate treatment) was carried out by dipping the support for a lithographic printing plate, obtained as described above, into a treatment cell with the aqueous solution containing 1 wt % of III-sodium silicate at a temperature of 30° C. for 10 sec. Then, the support was washed by water spraying using well water.

Undercoat solution containing a composition described below was coated on the support for a lithographic printing plate treated with the alkali metal silicate, obtained in the foregoing manner, and dried at a temperature of 80° C. for 15 sec., to form a coating layer. The coating amount after drying was 10 $mg/m^2$.

<Composition of Undercoat Solution>

| | |
|---|---|
| High-molecular compound described below | 0.2 g |
| Methanol | 100 g |
| Water | 1 g |

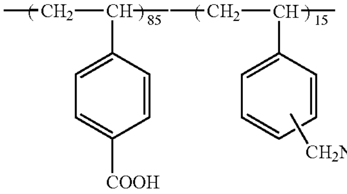

MOLECULAR WEIGHT 28,000

Subsequently, thermosensitive layer coating solution having a composition described below was prepared and, the thermosensitive coating solution was coated over the undercoated support for a lithographic printing plate, so that the amount after drying (the coating amount of thermosensitive layer) meets 1.7 $g/m^2$. Then, drying was carried out in order to form thermosensitive layer (thermal positive type image recording layer). In this way, the presensitized plate was obtained.

<Composition of Thermosensitive Layer Coating Solution>

| | |
|---|---|
| Novolac resin (m-cresol/p-cresol = 60/40, weight-average molecular weight 7,000, unreacted cresol 0.5 wt % contained) | 1.0 g |
| Cyanine dye A expressed by the following structural formula | 0.1 g |
| Tetrahydro phthalic anhydride | 0.05 g |
| p-toluensulfonic acid | 0.002 g |
| A compound formed by converting a counterion of ethylviolet into 6-hydroxy-β-naphthalenesulfonic acid | 0.02 g |
| Fluorine-containing surfactant (Megaface F-177 made by Dainippon Ink And Chemical, Incorporated) | 0.05 g |
| Methylethylketone | 12 g |

CYANINE DYE A

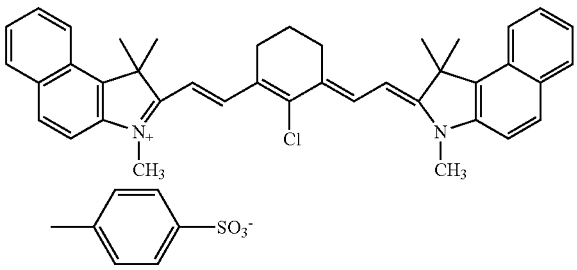

(3) Photopolymer Type Image Recording Layer

Solution that a polymer expressed by the following formula U-1 (number-average molecular weight: 10,000) was dissolved in a mixture solution of water/methanol-5/95 (weight ratio) was coated onto the support for a lithographic printing plate obtained above, and an undercoat layer (adhesive layer) was formed by drying the support at 80° C. for 30 seconds (Sol-Gel undercoat). The coating amount of an undercoat layer after drying was 10 $mg/m^2$.

U-1

U-1

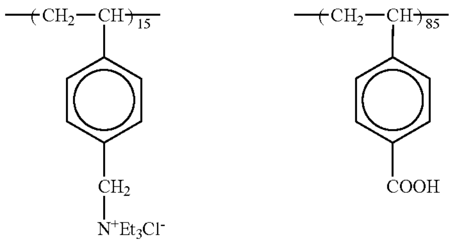

Furthermore, the high-sensitivity photopolymerizable composition P-1 of the following constitution was prepared, this composition was applied to the undercoated support for a lithographic printing plate such that a coated amount after being dried (coated amount of photosensitive layer) becomes 1.5 $g/m^2$, a photosensitive layer was formed by drying the support at 100° C. for one minute.

<Photopolymerizable Composition P-1>

| | |
|---|---|
| Compound containing ethylenic unsaturated bond expressed by the following formula A1 | 1.5 parts by weight |
| Linear organic polymer (high-molecular binder) expressed by the following formula B1 | 2.0 parts by weight |
| Sensitizer expressed by the following formula C1 | 0.15 parts by weight |
| Photopolymeric initiator expressed by the following formula D1 | 0.2 parts by weight |

-continued

| | |
|---|---|
| Dispersed substance of ε-phthalocyanine expressed by the following formula F1 | 0.02 parts by weight |
| Fluorine-containing nonionic surfactant (Megaface F-177 made by Dainippon Ink And Chemicals, Incorporated) | 0.03 parts by weight |
| Methylethylketone | 9.0 parts by weight |
| Propyleneglycol monomethylether acetate | 7.5 parts by weight |
| Toluene | 11.0 parts by weight |

A1

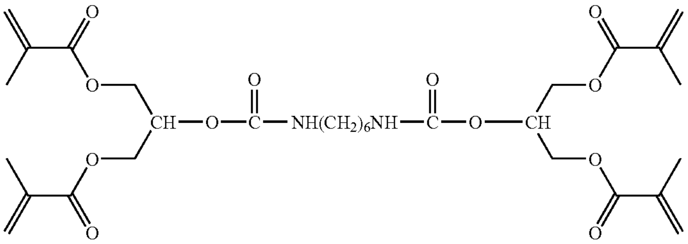

B1

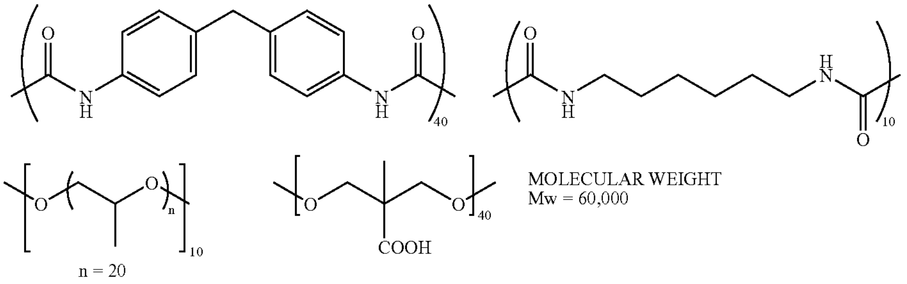

MOLECULAR WEIGHT
Mw = 60,000

C1

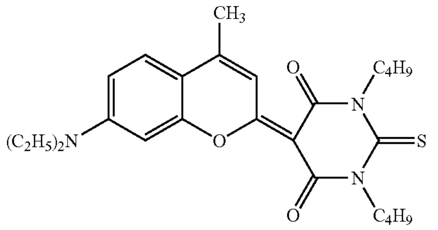

D1

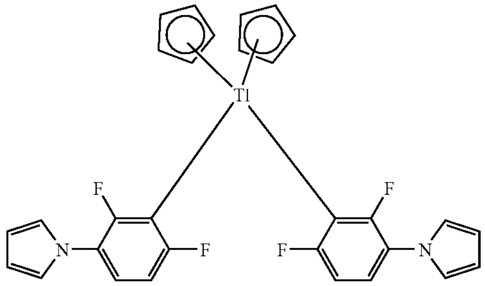

-continued

F1

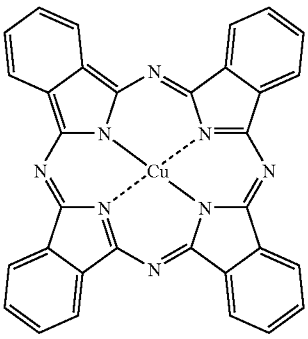

An aqueous solution of polyvinyl alcohol (degree of saponification 98 mol %, degree of polymerization 500) 3 wt % was coated onto this photosensitive layer such that a coated amount after drying meets 2.5 g/m$^2$, a photosensitive layer (photopolymer negative type image recording layer) was formed by drying the support at 120° C. for 3 min. and thus, a presensitized plate was obtained.

1-4. Exposure and Development Treatment

Image exposure and development treatment were performed on each presensitized plate obtained above in the following methods corresponding to image recording layers and a lithographic printing plate was obtained.

(1) In a case of Conventional Positive Type Image Recording Layer

Exposure was performed on a presensitized plate with a 3 kW metal halide lamp from a distance 1 meter away through a transparent positive film in a vacuum printing frame.

Thereafter, development treatment was performed with an alkali developer (developer 1) in which the following compound (a) was added to an aqueous solution 1L containing 4.0 wt % of potassium silicate of the mixing ratio of silicon oxide $SiO_2$ and potassium oxide $K_2O$, $SiO_2/K_2O$ was 1:1 and 0.015 wt % of OLFINE AK-02 (made by Nissin Chemical Industry Co., Ltd.) such that the concentration of the compound (a) is 1.0 g/L. Development treatment was performed at a development temperature of 25° C. for 12 seconds with an automatic processor PS900NP (made by Fuji Photo Film Co., Ltd.) filled with the aforementioned developer 1. After the development treatment was finished, treatment with gum (GU-7 (1:1) or the like was performed on the plate after water washing treatment was performed, and a lithographic printing plate with plate making completed was obtained. Note that, in place of the compound (a), even when an alkali developer containing the same addition of the following compound (b) or (c) as that of the compound (a) was used, development treatment could be performed in the same manner (and same in each of the Examples mentioned below).

<Compounds (a) to (c)>

Compound (a): $C_{12}H_{25}N\ (CH_2CH_2COONa)_2$

Compound (b): $C_{12}H_{25}O\ (CH_2CH_2O)_7H$

Compound (c): $(C_6H_{13})_2CHO(CH_2CH_2O)_{20}H$ (2) In a Case of Thermal Positive Type Image Recording Layer Image exposure was performed on a presensitized plate at a main scanning speed of 5 m/sec and printing plate energy of 140 mJ/cm$^2$, with CREO Inc.-made TrendSetter 3244 equipped with a semiconductor laser of output 500 mW, wavelength 830 nm and beam diameter 17 μm (1/e$^2$).

Thereafter, development treatment was performed on the presensitized plate with an alkali developer (developer 2) in which the compound (a) was added to an aqueous solution IL containing 5.0 wt % of potassium salt having D-sorbitol/potassium oxide $K_2O$ which was a combination of non-reducing sugar and base and OLFINE AK-02 (made by Nissin Chemical Industry Co., Ltd.) 0.015 wt %. This treatment was performed at a development temperature of 25° C. for 12 seconds with an automatic processor PS900NP (made by Fuji Photo Film Co., Ltd.) filled with the aforementioned developer 2. After the development treatment was over, water washing treatment was then performed, treatment with gum (GU-7 (1:1)) or the like was performed, and a lithographic printing plate with plate making completed was obtained.

(3) In a case of Photopolymer Type Image Recording Layer

Scanning exposure of a solid image and 1 to 99% dot image (in every 1%) was performed on the presensitized plate at an exposure amount of 100 μJ/cm$^2$ and 175 scanning lines/inch at 4,000 dpi with FD.YAG laser (Plate Jet 4 made by Cymbolic Sciences, Inc.). After exposure, preheating was performed under a condition that a printing plate reached a temperature of 100° C.

Standard treatment was then performed with an automatic processor (LP-850P2 made by Fuji Photo Film Co., Ltd.) filled with developer 3 of the following composition (pH 11.5 (at 25° C.) and electric conductivity 5 mS/cm) and finishing gum solution FP-2W (made by Fuji Photo Film Co., Ltd.). The temperature of the developer was 30° C., and the dipping time in the developer was about 15 seconds.

<Compositions of Developer 3>

| | |
|---|---|
| Potassium hydroxide | 0.15 g |
| Polyoxyethylenephenylether (number of constitutional repeating unit of polyoxyethylene chain: n = 13) | 5.0 g |
| Chelating agent (Chelest 400 made by Chelest Corporation) | 0.1 g |
| Water | 94.75 g |

1-5. Evaluation of a Lithographic Printing Plate

Scum resistance, scum resistance after being left, press life and easiness to observe amount of fountain solution of the presensitized plate obtained above were evaluated according to the following methods.

(1) Scum Resistance

Printing was performed in magenta ink of DIC-GEOS (s) with DAIYA-F-2 printing machine (made by Mitsubishi Heavy Industries, Ltd.) and the scum of a blanket was visually inspected after a printing of 10,000 sheets was carried out.

The results were shown in Table 1. Scum resistance was evaluated in ten levels according to the level of scum in the blanket. A larger number shows a better excellency in scum resistance.

(2) Scum Resistance After Being Left

In the evaluation of the aforementioned scum resistance, after a printing of 10,000 sheets was finished, they were left as they stand for one hour. After that, a printing was restarted and the scum of the blanket in the non-image areas was visually inspected.

The results were shown in Table 1. Scum resistance after being left was evaluated in four levels of ⊚, ○, Δ, and × from the order of a lesser extent of scum in the blanket.

(3) Press Life

Printing was performed in black ink of DIC-GEOS (N) made by Dainippon Ink And Chemicals, Incorporated with Lithrone Printing Machine made by Komori Corporation, and press life was evaluated by the number of the printed sheets at a time when a visual inspection recognizes that the density of a solid image begins to decrease.

The results were shown in Table 1.

(4) Inspectability of Plate

The lithographic printing plate obtained was mounted on the Lithrone Printing Machine made by Komori Corporation, the luster of non-image areas on the surface of a printing plate was visually observed while increasing the supplied amount of fountain solution, and the inspectability of a plate (easiness to observe amount of fountain solution) was evaluated by the supplied amount of fountain solution when the non-image areas began to luster.

The results were shown in Table 1. The inspectability was evaluated in three-steps in the order of ⊚, Δ, and × from non-image areas with a larger amount of fountain solution to that with a lesser amount of fountain solution when non-image areas began to luster.

As is clear from Table 1, a presensitized plate according to the present invention using a support for a lithographic printing plate of the first aspect according to the present invention (Examples 1-1 to 1-17), having on the surface thereof, a grain shape with a structure in which a grained structure with medium undulation of a specified aperture diameter and a grained structure with small undulation of a specified aperture diameter were superimposed was excellent in both scum resistance and press life when the plate was formed into a lithographic printing plate. Particularly, the depth with respect to the aperture diameter of a small undulation pit was sufficiently deep (Examples 1-1, 1-2 and 1-4 to 1-17), a plate was excellent in scum resistance.

In addition, if a grained structure with large undulation of a specified wavelength was further superimposed on the aforementioned grain shape (Examples 1-9 to 1-15 and 1-17), a lithographic printing plate was also excellent in both inspectability and scum resistance after being left.

On the contrary, if the average aperture diameter of small undulation pits was too large (Comparative Examples 1-1, 1-2 and 1-5), a plate was inferior in scum resistance. In addition, if the average aperture diameter of medium undulation pits was too large (Comparative Example 1-3) or was too small (Comparative Example 1-4), a plate was inferior in both scum resistance and press life. Furthermore, the average aperture diameters of both small undulation pits and medium undulation pits were too large (Comparative Example 1-14), a plate was inferior in press life. Moreover, if a plate was not provided with a grained structure with small undulation (Comparative Examples 1-6, 1-7 and 1-11), the plate was poor in scum resistance and if a plate was not provided with a grained structure with medium undulation (Comparative Examples 1-8 to 1-13), the plate was inferior in press life.

TABLE 1

| | Image recording layer<br>Interface treatment of support<br>Surface shape of support | | | | Conventional positive type | | | |
|---|---|---|---|---|---|---|---|---|
| | | | | | None | | | |
| | Large undulation | Medium Undulation | Small undulation | | | Scum | | |
| | Average wavelength (μm) | Average aperture diameter (μm) | Average aperture diameter (μm) | Average of ratios of depths to aperture diameters | Scum resistance | resistance after being left | Press life (10 thousand pieces) | Inspectability of plate |
| Example 1-1 | — | 1.4 | 0.14 | 0.46 | 10 | ○ | 11.0 | Δ |
| Example 1-2 | — | 1.4 | 0.16 | 0.22 | 8 | ○ | 11.0 | Δ |
| Example 1-3 | — | 1.4 | 0.15 | 0.16 | 8 | ○ | 12.0 | Δ |
| Example 1-4 | — | 1.4 | 0.18 | 0.22 | 8 | ○ | 10.0 | Δ |
| Example 1-5 | — | 1.4 | 0.07 | 0.22 | 7 | ○ | 11.0 | Δ |
| Example 1-6 | — | 1.4 | 0.03 | 0.30 | 8 | ○ | 10.0 | Δ |
| Comparative Example 1-1 | — | 1.4 | 0.25 | 0.20 | 6 | ○ | 11.0 | Δ |
| Comparative Example 1-2 | — | 1.4 | 0.25 | 0.12 | 5 | ○ | 11.0 | Δ |
| Example 1-7 | — | 3.5 | 0.14 | 0.46 | 8 | ○ | 9.0 | Δ |
| Example 1-8 | — | 1.0 | 0.14 | 0.46 | 8 | ○ | 10.0 | Δ |
| Comparative Example 1-3 | — | 5.6 | 0.14 | 0.46 | 4 | ○ | 9.0 | Δ |
| Comparative Example 1-4 | — | 0.4 | 0.14 | 0.46 | 6 | ○ | 10.0 | Δ |
| Example 1-9 | 65 | 1.4 | 0.14 | 0.46 | 10 | ⊚ | 10.0 | ○ |

TABLE 1-continued

| | | | | | | | | |
|---|---|---|---|---|---|---|---|---|
| Example 1-10 | 65 | 1.4 | 0.18 | 0.22 | 8 | ○ | 10.0 | ○ |
| Example 1-11 | 65 | 1.4 | 0.07 | 0.22 | 7 | ○ | 10.0 | ○ |
| Comparative Example 1-5 | 65 | 1.4 | 0.25 | 0.12 | 5 | ○ | 8.0 | ○ |
| Example 1-12 | 65 | 3.5 | 0.14 | 0.46 | 8 | ○ | 10.0 | ○ |
| Example 1-13 | 65 | 1.0 | 0.14 | 0.46 | 8 | ○ | 9.0 | ○ |
| Example 1-14 | 37 | 3.5 | 0.14 | 0.46 | 8 | ◎ | 11.0 | ○ |
| Example 1-15 | 14 | 1.4 | 0.14 | 0.46 | 7 | ◎ | 10.0 | ○ |
| Example 1-16 | 120 | 3.5 | 0.14 | 0.46 | 8 | ◎ | 9.0 | Δ |
| Example 1-17 | 79 | 3.5 | 0.14 | 0.46 | 10 | ◎ | 13.0 | ○ |
| Comparative Example 1-6 | 70 | 1.6 | — | — | 6 | ○ | 8.0 | ○ |
| Comparative Example 1-7 | — | 1.4 | — | — | 2 | ○ | 10.0 | Δ |
| Comparative Example 1-8 | 51 | — | 0.25 | 0.46 | 8 | ○ | 6.0 | ○ |
| Comparative Example 1-9 | 51 | — | 0.25 | 0.22 | 9 | ○ | 4.0 | ○ |
| Comparative Example 1-10 | 51 | — | 0.25 | 0.14 | 9 | ○ | 3.0 | ○ |
| Comparative Example 1-11 | 60 | — | — | — | 2 | ○ | 8.0 | ○ |
| Comparative Example 1-12 | — | — | 0.14 | 0.46 | 10 | Δ | 0.5 | X |
| Comparative Example 1-13 | 65 | — | 0.14 | 0.46 | 6 | X | 7.0 | ○ |
| Comparative Example 1-14 | — | 5.8 | 0.25 | 0.26 | 9 | ○ | 5.0 | ○ |

| | Thermal positive type Silicate treatment | | Photopolymer type None | |
|---|---|---|---|---|
| | Scum resistance | Press life (10 thousand pieces) | Scum resistance | Press life (10 thousand pieces) |
| Example 1-1 | 10 | 8.0 | 10 | 20.0 |
| Example 1-2 | | | | |
| Example 1-3 | | | | |
| Example 1-4 | 8 | 8.0 | | |
| Example 1-5 | | | | |
| Example 1-6 | | | | |
| Comparative Example 1-1 | 6 | 9.0 | | |
| Comparative Example 1-2 | | | | |
| Example 1-7 | | | | |
| Example 1-8 | 8 | 8.0 | | |
| Comparative Example 1-3 | | | | |
| Comparative Example 1-4 | 6 | 3.0 | | |
| Example 1-9 | 10 | 10.0 | 10 | 18.0 |
| Example 1-10 | 8 | 9.0 | | |
| Example 1-11 | | | | |
| Comparative Example 1-5 | | | | |
| Example 1-12 | 8 | 9.0 | | |
| Example 1-13 | | | | |
| Example 1-14 | | | | |
| Example 1-15 | 7 | 9.0 | | |
| Example 1-16 | | | | |
| Example 1-17 | | | | |
| Comparative Example 1-6 | 6 | 6.0 | 6 | 10.0 |
| Comparative Example 1-7 | 2 | 8.0 | 2 | 16.0 |
| Comparative Example 1-8 | 8 | 4.0 | 8 | 14.0 |
| Comparative Example 1-9 | | | | |
| Comparative Example 1-10 | | | | |
| Comparative Example 1-11 | 2 | 6.0 | 2 | 8.0 |

TABLE 1-continued

| | | | | |
|---|---|---|---|---|
| Comparative Example 1-12 | 10 | 0.5 | 10 | 0.5 |
| Comparative Example 1-13 | 6 | 5.0 | 6 | 12.0 |
| Comparative Example 1-14 | | | | |

<Example of the Second Aspect According to the Present Invention>

2-1. Preparation of a Support for a Lithographic Printing Plate

Example 2-1

A support for a lithographic printing plate according to Example 2-1 was obtained in the same method as in Example 1-9, except that the amount of an aluminum plate dissolved was set at 1.0 g/m$^2$ in (e) mentioned above.

Examples 2-2 to 2-6 and Comparative Examples 2-1 to 2-11

Supports for a lithographic printing plate according to Examples 2-2 to 2-6 and Comparative Examples 2-1 to 2-11 were obtained in the same methods as in Example 2-1, except that the conditions of each treatment were changed as shown in Table 2. Note that, "-" in Table 2 indicates that no treatment was performed. An electrolyte used for (d) electrolytic graining treatment in Comparative Example 2-6 was a electrolyte in which the concentration of hydrochloric acid was 1 wt % and that of acetic acid was 1 wt %. An electrolyte used in Examples 2-4 and 2-5 and Comparative Example 2-3 was each a solution in which aluminum ion concentration was 5 g/L.

2. Calculation of Factor of Surface Shape on a Support for a Lithographic Printing Plate With the surface of a support for a lithographic printing plate obtained above, $R_a$, ΔS, a30 and a60 were taken as follows:

The results were shown in Table 2.

(1) Measurement of Surface Shape with an Atomic Force Microscope

The shape of a surface was measured with an atomic force microscope (SP13700 made by Seiko Instruments Inc.) to find a three-dimensional data. Described below are the concrete steps.

Measurement was performed on the following conditions. That is, 1 cm-square of the support for a lithographic printing plate was cut off, the piece was set on a horizontal sample bench on a piezo scanner, a cantilever was moved closer to the surface of the sample, and when the cantilever reached an area where an atomic force functions, the sample was scanned in XY directions. While scanning, asperities of the sample were captured as piezo displacement in Z direction.

A piezo scanner capable of scanning 150 μm in XY directions and 10 μm in Z direction was used. A cantilever with resonance frequency of 120 to 150 kHz, and spring constant of 12 to 20 N/M (e.g., S1-DF20 made by NANOPROBE Inc.) was used, and measurement was performed in DFM mode (Dynamic Force Mode) A minor tilting of the sample was corrected by least square approximation method of the three-dimensional data obtained to find a reference plane.

A surface in 50 μm□ area was measured at 512×512 points. The resolution in XY directions was 1.9 μm, the resolution in Z direction was 1 nm, and scanning rate should was 60 μm/sec.

(2) Correction of Three-dimensional Data

While in the calculation of ΔS, the three-dimensional data found in (1) mentioned above was used as it was, in calculation of $R_a$, a30 and a60, a data that was corrected by removing components of wavelength 2 μm or longer from the three-dimensional data taken in (1) mentioned above was employed.

The correction was performed by performing the fast Fourier transform of the three-dimensional data taken in (1) mentioned above to find frequency distribution, and performing inverse Fourier transform after removing components of wavelength 2 μm or longer.

(3) Calculation of each Factor (i) $R_a$

Surface roughness $R_a$ was calculated by the following equation using the three-dimensional data (f (x, y)) obtained after a correction was performed in (2) mentioned above.

$$R_a = \frac{1}{S_0}\int_0^{Lx}\int_0^{Ly}|f(x, y)|\,dx\cdot dy$$

In the equation, each of $L_x$ and $L_y$ indicates the length of a side in x direction and y direction of a measured area (rectangle) and their relation was that $L_x=L_y=50$ μm in the Example. In addition, $S_0$ was a geometrically measured area and was found by an equation that $S_0=L_x\times L_y$.

(ii) ΔS

Adjacent three points were extracted using the three-dimensional data (f (x, y)) found in (1) mentioned above, and the total of areas of fine triangles formed by the three points was found, which was determined to be actual area $S_x$. Surface area ratio ΔS was found by the following equation from the obtained actual area $S_x$ and geometrically measured area $S_0$:

$$\Delta S=(S_x-S_0)/S_0\times 100(\%)$$

(iii) a30 and a60

Using the three-dimensional data (f (x, y)) obtained by correction in (2) mentioned above, an angle made between a reference plane and a fine triangle formed by the three points constituted by each reference point and adjacent two points in predetermined directions (for example, rightwards and downwards) was calculated, for each reference point. The number of reference points at which a gradient of the fine triangle is 300 or more (in the case of a30) or 60° or more (in the case of a60) was divided by the number of all reference points (herein, the number of all reference points was 511×511 points, that was obtained by subtracting the number of points which did not have adjacent two points in the predetermined directions from 512×512 points, that is, the number of all data). Accordingly, an area ratio a30 of a portion of gradient 30° or more and an area ratio a60 of a portion of gradient 60° or more were calculated.

3. Preparation of a Presensitized Plate

A presensitized plate was obtained by providing either of a thermal positive type image recording layer A or a conventional positive type image recording layer B in the same methods as in the examples of the first aspect according to the present invention on each support for a lithographic printing plate obtained above.

4. Exposure and Development Treatment

Image exposure and development treatment were performed on each support for a lithographic printing plate corresponding to an image recording layer in the following manner and a lithographic printing plate was obtained.

(1) In a Case of a Thermal Positive Type Image Recording Layer

Exposure and development treatment were performed in the same method as in the examples of the first aspect according to the present invention as mentioned above and a lithographic plate was obtained.

(2) In a case of a Conventional Positive Type Image Recording Layer

Exposure and development treatment were performed to obtain a lithographic printing plate in the same method as in the examples of the first aspect according to the present invention, except that the aforementioned developer 2 was used in place of the aforementioned developer 1.

5. Evaluation of a Lithographic Printing Plate

Scum resistance, press life, scum resistance after being left and inspectability of plate of the lithographic printing plate were evaluated in the following manner.

(1) Scum Resistance

Scum resistance was evaluated in the same method as in the examples of the first aspect according to the present invention as mentioned above.

The results were shown in Tables 3 and 4.

(2) Press Life

Press life resistance was evaluated in the same method as in the examples of the first aspect according to the present invention as mentioned above.

The results were shown in Tables 3 and 4. Note that press life was expressed in relative value that the number of printed sheets with a lithographic printing plate provided with image recording layer A on a support for a lithographic printing plate in Example 2-5 was determined to be 100.

(3) Scum Resistance After Being Left

Scum resistance after being left was evaluated in the same method as in the examples of the first aspect according to the present invention as mentioned above.

Note that, if image recording layer B was provided, the same evaluation was performed with a lithographic printing plate on which development treatment was performed under the same conditions, except that developer 1 was used in place of developer 2 after the plate was exposed, for comparison.

The results were shown in Tables 3 and 4. Scum resistance after being left was evaluated in 10 levels according to the extent of scum in a blanket. A larger number indicates that a plate has better scum resistance after being left.

(4) Inspectability of Plate

Inspectability of plate was evaluated in the same method as in the examples of the first aspect according to the present invention as mentioned above.

The results were shown in Table 3. A plate with a larger amount of fountain solution to a smaller amount of fountain solution when the plate was beginning to luster was evaluated in three-steps of ○, Δ, and ×.

As apparent from Tables 3 and 4, a presensitized plate according to the present invention using the support for a lithographic printing plate of the second aspect according to the present invention, in which $R_a$, ΔS, a30 and a60 obtained from the three-dimensional data taken by measuring 512×512 points in 50 μm-square on the surface of a plate with an atomic force microscope each meets the specified conditions (Examples 2-1 to 2-6), was excellent in both scum resistance and press life when the plate was formed into a lithographic printing plate. It was also excellent in both scum resistance after being left and inspectability of plate.

Particularly, Table 4 shows that when a support for a lithographic printing plate on which no alkali metal silicate treatment was performed was used (i.e., when image recording layer B was provided), although development treatment was performed on the plate with developer 2 containing substantially no alkali metal silicate, it exerted scum resistance after being left equivalent to a case if development treatment was performed on the plate with developer 1 containing alkali metal silicate.

TABLE 2

| | Surface treatment | | | | | | Surface shape | | | |
|---|---|---|---|---|---|---|---|---|---|---|
| | (a) Mechanical graining treatment Press load of brush roller | (d) Electrolytic graining treatment Electrolyte/ Quantity of electricity ($C/dm^2$) | (e) Alkali etching treatment Amount of dissolved Al ($g/m^2$) | (g) Electrolytic graining treatment Concentration of electrolyte (g/L) | (h) Alkali etching treatment Amount of dissolved Al ($g/m^2$) | (i) Desmutting treatment | $R_1$ (μm) | ΔS (%) | a30 (%) | a60 (%) |
| Example 2-1 | 7 | Nitric acid/220 | 1.0 | 7.5 | 0.1 | Performed | 0.49 | 41 | 69.7 | 9.1 |
| Example 2-2 | 7 | Nitric acid/220 | 3.5 | 7.5 | 0.1 | Performed | 0.52 | 31 | 56.4 | 6.1 |
| Comparative Example 2-1 | 7 | Nitric acid/220 | 6.0 | 7.5 | 0.1 | Performed | 0.50 | 31 | 50.2 | 7.0 |
| Example 2-3 | 7 | Nitric acid/220 | 1.0 | 7.5 | 1.0 | Performed | 0.52 | 39 | 60.3 | 5.0 |
| Comparative Example 2-2 | 7 | Nitric acid/220 | 1.0 | 7.5 | 5.0 | Performed | 0.50 | 28 | 57.0 | 3.3 |

TABLE 2-continued

| | Surface treatment | | | | | | Surface shape | | | |
|---|---|---|---|---|---|---|---|---|---|---|
| | (a) Mechanical graining treatment Press load of brush roller | (d) Electrolytic graining treatment Electrolyte/ Quantity of electricity ($C/dm^2$) | (e) Alkali etching treatment Amount of dissolved Al ($g/m^2$) | (g) Electrolytic graining treatment Concentration of electrolyte (g/L) | (h) Alkali etching treatment Amount of dissolved Al ($g/m^2$) | (i) Desmutting treatment | $R_1$ (μm) | ΔS (%) | a30 (%) | a60 (%) |
| Example 2-4 | 7 | Nitric acid/220 | 1.0 | 2.5 | 0.1 | Performed | 0.51 | 40 | 67.2 | 5.7 |
| Example 2-5 | 7 | Nitric acid/220 | 1.0 | 5.0 | 0.1 | Performed | 0.53 | 35 | 64.8 | 6.0 |
| Comparative Example 2-3 | 7 | Nitric acid/220 | 1.0 | 10.0 | 0.1 | Performed | 0.49 | 29 | 68.0 | 7.1 |
| Example 2-6 | — | Hydrochloric acid/ 1500 | 6.0 | — | — | — | 0.78 | 30 | 55.5 | 5.2 |
| Comparative Example 2-4 | — | Hydrochloric acid/ 1500 | 1.0 | — | — | — | 0.74 | 35 | 60.0 | 12.3 |
| Comparative Example 2-5 | — | Hydrochloric acid/ 800 | 6.0 | — | — | — | 0.60 | 22 | 46.2 | 2.4 |
| Comparative Example 2-6 | — | Hydrochloric acid + Acetic acid/800 | 10 | — | — | — | 0.53 | 28 | 55.9 | 4.3 |
| Comparative Example 2-7 | — | Nitric acid/400 | 1.0 | — | — | — | 0.69 | 41 | 59.5 | 12.1 |
| Comparative Example 2-8 | — | Nitric acid/400 | 5.0 | — | — | — | 0.60 | 28 | 56.0 | 8.7 |
| Comparative Example 2-9 | 7 | Nitric acid/220 | 3.5 | — | — | — | 0.59 | 29 | 52.2 | 6.0 |
| Comparative Example 2-10 | 3 | Nitric acid/220 | 1.0 | — | — | — | 0.40 | 45 | 62.5 | 15.0 |
| Comparative Example 2-11 | 3 | Nitric acid/220 | 5.0 | — | — | — | 0.39 | 39 | 57.0 | 9.4 |

TABLE 3

| Presensitized plate | | Printing characteristics | | | |
|---|---|---|---|---|---|
| Support for lithographic printing plate | Image recording layer | Scum resis-tance | Press life | Scum resistance after being left | Inspectability of plate |
| Example 2-1 | A | 8 | 140 | 8 | ○ |
| Example 2-2 | A | 9 | 120 | 8 | ○ |
| Comparative Example 2-1 | A | 10 | 80 | 8 | ○ |
| Example 2-3 | A | 8 | 120 | 8 | ○ |
| Comparative Example 2-2 | A | 9 | 80 | 6 | ○ |
| Example 2-4 | A | 10 | 120 | 7 | ○ |
| Example 2-5 | A | 10 | 100 | 7 | ○ |
| Comparative Example 2-3 | A | 7 | 60 | 6 | ○ |
| Example 2-6 | A | 7 | 100 | 7 | ○ |
| Comparative Example 2-4 | A | 4 | 150 | 2 | ○ |
| Comparative Example 2-5 | A | 7 | 60 | 7 | ○ |
| Comparative Example 2-6 | A | 8 | 120 | 3 | Δ |
| Comparative Example 2-7 | A | 4 | 100 | 4 | ΔX |
| Comparative Example 2-8 | A | 5 | 80 | 5 | ΔX |
| Comparative Example 2-9 | A | 6 | 100 | 6 | ○ |
| Comparative Example 2-10 | A | 7 | 80 | 6 | Δ |
| Comparative Example 2-11 | A | 7 | 60 | 6 | Δ |

TABLE 4

| Presensitized plate | | Printing characteristics | | | |
|---|---|---|---|---|---|
| | | | | Scum resistance after being left | |
| Support for lithographic printing plate | Image recording layer | Scum resistance | Press life | Developer 2 | Developer 1 |
| Example 2-1 | B | 8 | 140 | 8 | 8 |
| Example 2-2 | B | 9 | 120 | 8 | 8 |
| Comparative Example 2-1 | B | 10 | 80 | 8 | 8 |
| Comparative Example 2-2 | B | 9 | 60 | 2 | 6 |
| Example 2-4 | B | 10 | 120 | 7 | 7 |
| Comparative Example 2-3 | B | 7 | 80 | 4 | 6 |
| Example 6 | B | 7 | 80 | 7 | 7 |
| Comparative Example 2-5 | B | 7 | 60 | 6 | 7 |
| Comparative Example 2-7 | B | 4 | 100 | 2 | 4 |
| Comparative Example 2-9 | B | 6 | 80 | 4 | 6 |

<Example of the Third Aspect According to the Present Invention>

3-1. Preparation of a Support for a Lithographic Printing Plate

Example 3-1

The aforementioned surface treatments (a) to (i) were performed on an aluminum plate in the same method as in Example 1-9, except that the amount of the aluminum plate dissolved was set at 3.5 g/$m^2$ in (e) mentioned above.

Continuously, a water receptive layer was formed and a presensitized plate according to the present invention was prepared by providing an image recording layer. However, before that, a factor that specifies the physical properties on the surface of an aluminum plate was measured. In addition, the support prepared in Example 3-1 (before the formation of a water receptive layer) was determined to be "Support A".

Examples 3-2 to 3-4 and Comparative Examples 3-1 to 3-5

Supports according to Examples 3-2 to 3-4 and Comparative Examples 3-1 to 3-5 on which water receptive layers were not yet formed were obtained (determined to be "Support B" to "Support I" in order) in the same method as in Example 3-1, except that the conditions of each treatment were changed as shown in Table 5. In addition, "-" in Table 5 indicates that no treatment was performed.

3-2. Calculation of a Factor on the Surface Shape of a Support for a Lithographic Printing Plate With regard to the surface of a support for a lithographic printing plate obtained above, $R_a$, ΔS, a30 and a60 were taken in the same methods as in the examples of the second aspect according to the present invention as mentioned above.

The results were shown in Table 5.

3-3. Preparation of a Presensitized Plate

Examples 3-5 to 3-20 and Comparative Examples 3-6 to 3-43

A water receptive layer was formed on the supports A to I prepared in Examples 3-1 to 3-4 and Comparative Examples 3-1 to 3-5 in the combinations as shown in Table 6 in the following methods.

<Water Receptive Layer Formation Process I>

By using the anodizing device having a structure shown in FIG. 4, Anodizing treatment was carried out to obtain a support for a lithographic printing plate. An electrolyte supplied for each of the first and second electrolytic portions was sulfuric acid. For each electrolyte, the concentration of sulfuric acid was 170 g/L (containing 0.5 wt % of aluminum ion) and a temperature was 38° C. Then, washing was performed by spraying water. The final amount of an anodized layer was 2.7 g/$m^2$.

The thermal conductivity of an anodized layer was measured with the aforementioned device and the average value of measurements at 5 points was found. When measuring the thermal conductivity, metal aluminum and aluminum oxide (alumina) were measured every time and a compensation was made by comparing the measured values with each referential value. As the thermal conductivity was found by the following formula [1], it was 0.4 W/(m·K).

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad [1]$$

<Water Receptive Layer Formation Process II>

First, water receptive layer formation process I was performed. Pore widening treatment (PW treatment) was then performed to lower the thermal conductivity of an anodized layer. Pore widening treatment was performed by dipping a plate in a sodium hydroxide aqueous solution controlled at pH 13 at 30° C. for 70 sec.

The final amount of an anodized layer was 1.6 g/$m^2$. As the thermal conductivity of an anodized layer was found as in the aforementioned, it was 0.05 W/(m·K).

(Water Receptive Layer Formation Process III>

The treatment was performed in the same conditions as in water receptive layer formation process I, except that oxalic acid was used as an electrolyte.

As the thermal conductivity of an anodized layer was found, it was 0.2 W/(m·K).

<Water Receptive Layer Formation Process IV>

A $SiO_2$ layer was vapor deposited on a support with a generally used reactive sputtering process. Concretely, the treatment was performed using $SiO_2$ as a target with a high-frequency power supply of 500 W at a pressure of $6.7\times10^{-1}$ Pa for 20 minutes and 30 seconds to provide a $SiO_2$ layer of 0.2 μm. As the thermal conductivity of a $SiO_2$ layer was found, it was 0.2 W/(m·K).

<Water Receptive Layer Formation Process V>

An aluminum layer was vapor deposited on a support with a generally used magnetron sputtering process. Concretely, an aluminum layer having a thickness of 0.2 μm was provided with an ordinary vapor deposition method.

As the thermal conductivity of an aluminum layer was found, it was 237 W/(m·K).

<Water Receptive Layer Formation Process VI>

An $Al_2O_3$ layer was vapor deposited on a support with a generally used reactive sputtering process. Concretely, the treatment was performed using $Al_2O_3$ as a target with a high-frequency power supply of 500 W at a pressure of $6.7\times10^{-1}$ Pa for 44 minutes and 45 seconds to provide an $Al_2O_3$ layer having a thickness of 0.2 μm. As the thermal conductivity of an $Al_2O_3$ layer was found, it was 36 W/(m·K).

A presensitized plate was obtained by providing a thermal positive working image recording layer in the same method as in the example of the first aspect according to the present invention on each support for a lithographic printing plate obtained in the aforementioned after a water receptive layer was formed.

4. Exposure and Development Treatment

A lithographic printing plate was obtained by performing image exposure and development treatment on each presensitized plate obtained in the aforementioned in the following method.

Exposure was performed as to allow an amount of printing plate energy to be changed to 10, 20, 30, 40, 50, 60, 70, 80, 90, 100, 120, 150, 170, 200, 400 and 800 mJ/$cm^2$ with main scanning speed fixed at 1 m/sec. using CREO Inc.-made TrenndSetter3244 equipped with a semiconductor laser of wavelength 830 nm and beam diameter 8 μm (1/$e^2$). Note that, a plate with exposure so performed as to allow an amount of printing plate energy to be 150 mJ/$cm^2$ was used to evaluate scum resistance and press life to be described later.

Development treatment was then performed with developer 2. This development was performed with an automatic processor PS900NP (made by Fuji Photo Film Co., Ltd.) filled with the aforementioned alkali developer under the conditions at a development temperature of 25° C. for 12 seconds. After the development treatment was finished, treatment with gum (GU-7 (1:1)) or the like were performed, and a lithographic printing plate was obtained with plate making completed.

5. Evaluation of a Presensitized Plate and a Lithographic Printing Plate

Scum resistance and press life of the lithographic printing plate obtained as mentioned above and the sensitivity of a presensitized plate were evaluated in the following method.

(1) Scum Resistance

With regard to a lithographic printing plate using supports A to I after a $SiO_2$ layer was provided thereon, scum resistance was evaluated in the same method as in the example of the first aspect according to the present invention as mentioned above.

The results were shown in Table 5.

(2) Press Life

With regard to a lithographic printing plate using supports A to I after the $SiO_2$ layer was provided on them, press life was evaluated in the same method as in the example of the first aspect according to the present invention as mentioned above.

The results were shown in Table 5. In addition, press life is expressed in a relative value that the number of printed sheets performed by a lithographic printing plate where a support for a lithographic printing plate in Example 3-4 is provided with the image recording layer was determined to be 100.

(3) Sensitivity

Sensitivity was evaluated by an exposure amount when a degree of whiteness in non-image areas after development treatment was performed became the same as in that of a support.

The results were shown in Table 6. Note that, it indicated that the smaller the amount of an exposure (amount of printing plate energy), the higher the sensitivity as development could be performed by a lower exposure, and on the contrary, the larger the amount of an exposure is, the lower the sensitivity as development could not be performed unless an exposure is high.

TABLE 6

| | Support | Water receptive layer formation process | Sensitivity ($mJ/cm^2$) |
|---|---|---|---|
| Example 3-5 | A | I | 70 |
| Example 3-6 | A | II | 40 |
| Example 3-7 | A | III | 50 |
| Example 3-8 | A | IV | 50 |
| Example 3-9 | B | I | 70 |
| Example 3-10 | B | II | 40 |
| Example 3-11 | B | III | 50 |
| Example 3-12 | B | IV | 50 |
| Example 3-13 | C | I | 70 |
| Example 3-14 | C | II | 40 |
| Example 3-15 | C | III | 50 |
| Example 3-16 | C | IV | 50 |
| Example 3-17 | D | I | 70 |
| Example 3-18 | D | II | 40 |
| Example 3-19 | D | III | 50 |
| Example 3-20 | D | IV | 50 |
| Comparative Example 3-6 | A | V | 800 |
| Comparative Example 3-7 | A | VI | 150 |
| Comparative Example 3-8 | B | V | 800 |
| Comparative Example 3-9 | B | VI | 150 |
| Comparative Example 3-10 | C | V | 800 |
| Comparative Example 3-11 | C | VI | 150 |
| Comparative Example 3-12 | D | V | 800 |
| Comparative Example 3-13 | D | VI | 150 |
| Comparative Example 3-14 | E | I | 70 |
| Comparative Example 3-15 | E | II | 40 |
| Comparative Example 3-16 | E | III | 50 |
| Comparative Example 3-17 | E | IV | 50 |
| Comparative Example 3-18 | E | V | 800 |
| Comparative Example 3-19 | E | VI | 150 |
| Comparative Example 3-20 | F | I | 80 |
| Comparative Example 3-21 | F | II | 50 |
| Comparative Example 3-22 | F | III | 60 |
| Comparative Example 3-23 | F | IV | 60 |
| Comparative Example 3-24 | F | V | 800 |
| Comparative Example 3-25 | F | VI | 170 |
| Comparative Example 3-26 | G | I | 65 |
| Comparative Example 3-27 | G | II | 40 |
| Comparative Example 3-28 | G | III | 50 |

TABLE 5

| | | Conditions of surface treatment | | | | | | | | | | Printing characteristics | |
|---|---|---|---|---|---|---|---|---|---|---|---|---|---|
| | Sup-port | Process (a) Press load of brush roller | Process (d) Electrolyte/ Quantity of electricity ($C/dm^2$) | Process (e) Amount of dissolved Al ($g/m^2$) | Process (g) Concentration of electrolyte (g/L) | Process (h) Amount of dissolved Al ($g/m^2$) | Pro-cess (i) | Surface Shape $R_a$ | ΔS | a30 | a60 | Scum resis-tance | Press life |
| Example 3-1 | A | 7 | Nitric acid/220 | 3.5 | 7.5 | 0.1 | Per-formed | 0.52 | 31 | 56.4 | 6.1 | 10 | 120 |
| Example 3-2 | B | 7 | Nitric acid/220 | 6.0 | 2.5 | 0.1 | Per-formed | 0.51 | 40 | 67.2 | 5.7 | 9 | 120 |
| Example 3-3 | C | 7 | Nitric acid/220 | 6.0 | 5.0 | 0.1 | Per-formed | 0.53 | 35 | 64.8 | 6.0 | 9 | 100 |
| Example 3-4 | D | — | Hydrochloric acid/1500 | 6.0 | — | — | — | 0.78 | 30 | 55.5 | 5.2 | 7 | 100 |
| Comparative Example 3-1 | E | 7 | Nitric acid/220 | 6.0 | 7.5 | 0.1 | Per-formed | 0.50 | 31 | 50.2 | 7.0 | 9 | 80 |
| Comparative Example 3-2 | F | 7 | Nitric acid/220 | 6.0 | 10.0 | 0.1 | Per-formed | 0.49 | 29 | 68.0 | 7.1 | 7 | 60 |
| Comparative Example 3-3 | G | — | Hydrochloric acid/800 | 6.0 | — | — | — | 0.60 | 22 | 46.2 | 2.4 | 7 | 60 |
| Comparative Example 3-4 | H | — | Nitric acid/400 | 1.0 | — | — | — | 0.69 | 41 | 59.5 | 12.1 | 5 | 100 |
| Comparative Example 3-5 | I | 7 | Nitric acid/220 | 3.5 | — | — | — | 0.59 | 29 | 52.2 | 6.0 | 6 | 100 |

TABLE 6-continued

| | Support | Water receptive layer formation process | Sensitivity ($mJ/cm^2$) |
|---|---|---|---|
| Comparative Example 3-29 | G | IV | 50 |
| Comparative Example 3-30 | G | V | 800 |
| Comparative Example 3-31 | G | VI | 150 |
| Comparative Example 3-32 | H | I | 80 |
| Comparative Example 3-33 | H | II | 50 |
| Comparative Example 3-34 | H | III | 60 |
| Comparative Example 3-35 | H | IV | 60 |
| Comparative Example 3-36 | H | V | 900 |
| Comparative Example 3-37 | H | VI | 200 |
| Comparative Example 3-38 | I | I | 75 |
| Comparative Example 3-39 | I | II | 45 |
| Comparative Example 3-40 | I | III | 50 |
| Comparative Example 3-41 | I | IV | 50 |
| Comparative Example 3-42 | I | V | 800 |
| Comparative Example 3-43 | I | VI | 170 |

As apparent from Tables 5 and 6, a presensitized plate according to the present invention using the support for a lithographic printing plate of the third aspect according to the present invention, wherein $R_a$, ΔS, a30 and a60 obtained from the three-dimensional data taken by measuring 512×512 points in 50 μm-square on the surface of a plate with an atomic force microscope each meets the specified conditions (Examples 3-1 to 3-4) and a water receptive layer that the thermal conductivity meets the specified conditions was formed on its surface, was excellent in both scum resistance and press life when a lithographic printing plate was prepared. It also had a sufficient performance even if an exposure was lower since the sensitivity was higher.

What is claimed is:

1. A support for a lithographic printing plate obtainable by performing at least electrochemical graining treatment by an electrolyte containing a hydrochloric acid and subsequent alkali etching treatment in which an amount of etching is 0.5 $g/m^2$ or less on an aluminum plate, having on its surface thereof, a grain shape with a structure in which a grained structure with medium undulation of 0.5 to 5 μm average aperture diameter and a grained structure with small undulation of 0.01 to 0.18 μm average aperture diameter are superimposed.

2. A support for a lithographic printing plate obtainable by performing at least electrochemical graining treatment by an electrolyte containing a hydrochloric acid and subsequent alkali etching treatment in which an amount of etching is 0.5 $g/m^2$ or less on an aluminum plate, having on its surface thereof, a grain shape with a structure in which a grained structure with large undulation of 5 to 100 μm average wavelength, a grained structure with medium undulation of 0.5 to 5 μm average aperture diameter, and a grained structure with small undulation of 0.01 to 0.18 μm average aperture diameter are superimposed.

3. The support for a lithographic printing plate according to claim 1, in which an average of ratios of depths to the aperture diameters of the aforementioned grained structure with small undulation is 0.2 or more.

4. The support for a lithographic printing plate according to claim 1, including a water receptive layer with thermal conductivity of 0.05 to 0.5W/(m·K) on the surface.

5. A method of producing a lithographic printing plate by exposing a presensitized plate provided with an image recording layer on the support for a lithographic printing plate according to claim 1 and subsequently developing with a developer containing substantially no alkali metal silicate.

6. A method of producing a lithographic printing plate by exposing a presensitized plate provided with an image recording layer on the support for a lithographic printing plate according to claim 2 and subsequently developing with a developer containing substantially no alkali metal silicate.

7. The support for a lithographic printing plate according to claim 1, in which the grained structure with the medium undulation is formed by electrochemical graining treatment by an electrolyte containing a nitric acid and the grained structure with small undulation is formed by the electrochemical graining treatment by an electrolyte containing a hydrochloric acid.

8. The support for a lithographic printing plate according to claim 4, in which the water receptive layer is obtainable by performing anodizing treatment on the aluminum plate to make an anodized layer and pore widening treatment to the anodized layer.

9. The support for a lithographic printing plate according to claim 4, in which the water receptive layer is a $SiO_2$ layer.

10. The support for a lithographic printing plate according to claim 4, in which the water receptive layer is obtainable by sputtering process.

11. The support for a lithographic printing plate according to claim 10, in which the water receptive layer is an $Al_2O_3$ layer.

12. A presensitized plate provided with an image recording layer on the support for a lithographic printing plate according to claim 1, in which the image recording layer is a thermosensitive layer of the thermal positive type containing an alkali-soluble high-molecular compound and a photothermal conversion agent.

13. A presensitized plate provided with an image recording layer on the support for a lithographic printing plate according to claim 1, in which the image recording layer is a photosensitive layer of the photopolymer type containing a compound containing ethylenic unsaturated bonding capable of addition polymerization, a photopolymerization initiator and a high-molecular binding agent.

14. A presensitized plate provided with an image recording layer on the support for a lithographic printing plate according to claim 1, in which the image recording layer is a photosensitive layer of the conventional positive type containing an o-quinonediazide compound and a high-molecular compound that is water-insoluble and alkali-soluble.

* * * * *